US012568163B2

(12) United States Patent
Choi et al.

(10) Patent No.: US 12,568,163 B2
(45) Date of Patent: Mar. 3, 2026

(54) DISPLAY PANEL AND ELECTRONIC DEVICE HAVING THE SAME

(71) Applicant: Samsung Display Co., Ltd., Yongin-si (KR)

(72) Inventors: Kyung Hyun Choi, Seoul (KR); Semyung Kwon, Yongin-si (KR); Sanghoon Oh, Seoul (KR); Jingoo Jung, Seongnam-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 745 days.

(21) Appl. No.: 17/841,195

(22) Filed: Jun. 15, 2022

(65) Prior Publication Data

US 2022/0406867 A1     Dec. 22, 2022

(30) Foreign Application Priority Data

Jun. 18, 2021     (KR) ........................ 10-2021-0079462

(51) Int. Cl.
H04M 1/02          (2006.01)
G06F 3/041         (2006.01)
(Continued)

(52) U.S. Cl.
CPC ........ H04M 1/0268 (2013.01); H10K 59/124 (2023.02); H10K 59/126 (2023.02);
(Continued)

(58) Field of Classification Search
CPC .. H10K 59/126; H10K 59/8792; H10K 59/38; H10K 50/80; H10K 50/858;
(Continued)

(56) References Cited

U.S. PATENT DOCUMENTS 9,761,651 B2      9/2017  Chang et al.
2015/0123098 A1*  5/2015  Kang ................... H10K 50/844
                                                                438/151
(Continued)

FOREIGN PATENT DOCUMENTS

CN          112861651        5/2021
EP            3796385        3/2021
(Continued)

OTHER PUBLICATIONS

Zhang, Investigation of the Optical Properties of a-Si:H Films Deposited be PECVD Using Various Experimental Techniques, 2021 (Year: 2021).*

(Continued)

*Primary Examiner* — Britt Hanley
*Assistant Examiner* — Casey Paul Boatman
(74) *Attorney, Agent, or Firm* — Harness, Dickey & Pierce, P.L.C.

(57) ABSTRACT

An electronic device includes a display panel. The display panel includes a substrate, a light blocking layer disposed on the substrate, the light blocking layer including a first opening that defines a transmission area, at least one lower insulating layer disposed between the light blocking layer and the substrate, the at least one lower insulating layer including a second opening that overlaps the first opening, pixel circuits disposed on the light blocking layer, light emitting elements electrically connected to the pixel circuits, and an encapsulation layer overlapping the light emitting elements.

34 Claims, 12 Drawing Sheets

(51) Int. Cl.

| | |
|---|---|
| *G09G 3/00* | (2006.01) |
| *G09G 3/32* | (2016.01) |
| *H10K 59/124* | (2023.01) |
| *H10K 59/126* | (2023.01) |
| *H10K 59/38* | (2023.01) |
| *H10K 59/40* | (2023.01) |
| *H10K 59/65* | (2023.01) |
| *H10K 59/80* | (2023.01) |
| *H10K 77/00* | (2023.01) |

(52) U.S. Cl.
CPC ......... *H10K 59/65* (2023.02); *H10K 59/8792* (2023.02); *H10K 77/00* (2023.02); *G06F 3/0412* (2013.01); *G09G 3/035* (2020.08); *G09G 3/32* (2013.01); *G09G 2300/0819* (2013.01); *G09G 2300/0842* (2013.01); *G09G 2300/0861* (2013.01); *G09G 2320/0257* (2013.01); *H10K 59/38* (2023.02); *H10K 59/40* (2023.02)

(58) Field of Classification Search
CPC ...... H10K 59/124; H10K 59/65; H10K 59/40; H10K 77/00; G06F 3/0412; H04M 1/0268; G09G 3/0412; G09G 3/035; G09G 3/32; G09G 2300/0842; G09G 2300/0861; G09G 2320/0257
See application file for complete search history.

(56) References Cited

U.S. PATENT DOCUMENTS

| | | | | |
|---|---|---|---|---|
| 2020/0066802 | A1* | 2/2020 | Lee | H10K 50/8426 |
| 2020/0124910 | A1* | 4/2020 | Hwang | H10K 59/126 |
| 2020/0328257 | A1 | 10/2020 | Kim et al. | |
| 2020/0328375 | A1 | 10/2020 | Won | |
| 2020/0357871 | A1 | 11/2020 | Chung et al. | |
| 2021/0036068 | A1* | 2/2021 | Zhao | H10K 77/111 |
| 2021/0072864 | A1* | 3/2021 | Park | G06F 3/04166 |
| 2021/0091157 | A1* | 3/2021 | Oh | H10K 59/123 |
| 2021/0143231 | A1* | 5/2021 | Chae | H10D 86/481 |
| 2021/0175303 | A1* | 6/2021 | Bang | H10K 59/65 |
| 2023/0010919 | A1* | 1/2023 | Oh | H10K 59/121 |

FOREIGN PATENT DOCUMENTS

| | | |
|---|---|---|
| KR | 10-2016-0117728 | 10/2016 |
| KR | 10-2020-0039866 | 4/2020 |
| KR | 10-2180037 | 11/2020 |

OTHER PUBLICATIONS

Podlucky, Optimization of Fabrication Process for SiON/SiOx Films Applicable as Optical Waveguides, 2021 (Year: 2021).*
Xu, A Comparison of Structures and Properties of SiNx and SiOx Films Prepared by PECVD, 2012 (Year: 2012).*
Yamaguchi, Transparent Polymer Blends Composed of Cellulose Acetate Propionate and Poly(epichlorohydrin), 2007 (Year: 2007).*

\* cited by examiner

DR3

DR3

DISPLAY PANEL AND ELECTRONIC DEVICE HAVING THE SAME

CROSS-REFERENCE TO RELATED APPLICATION(S)

This application claims priority to and benefits of Korean Patent Application No. 10-2021-0079462 under 35 U.S.C. § 119, filed on Jun. 18, 2021 in the Korean Intellectual Property Office, the entire contents of which are incorporated herein by reference.

BACKGROUND

1. Technical Field

The disclosure relates to a display panel having improved transmittance in an area thereof and an electronic device including the display panel.

2. Description of the Related Art

An electronic device may include various electronic parts such as a display panel, an electronic module, and the like. The electronic module may include a camera, an infrared sensor, or a proximity sensor. The electronic module may be disposed under or below the display panel. A portion of the display panel may have a transmittance higher than that of another portion of the display panel. The electronic module receives an external input through the portion of the display panel or provides an output through the portion of the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel having improved transmittance in an area thereof.

The disclosure provides an electronic device capable of improving a quality of signals acquired or received by an electronic module.

Embodiments provide an electronic device that may include a display panel including a first area including a transmission area and an element area; and a second area adjacent to the first area; a window disposed on the display panel; an electronic module disposed below the first area of the display panel; and a housing disposed below the display panel and the electronic module. The display panel may include a substrate; a light blocking layer disposed on the substrate, the light blocking layer including a first opening that defines the transmission area; at least one lower insulating layer disposed between the light blocking layer and the substrate, the at least one lower insulating layer including a second opening that overlaps the first opening; pixel circuits disposed on the light blocking layer; light emitting elements electrically connected to the pixel circuits, and an encapsulation layer overlapping the light emitting elements.

A sidewall of the light blocking layer defining the first opening of the light blocking layer may be aligned with a sidewall of the at least one lower insulating layer defining the second opening of the at least one lower insulating layer.

The at least one lower insulating layer may include a first lower insulating layer disposed between the substrate and the light blocking layer; and a second lower insulating layer disposed between the first lower insulating layer and the substrate, and the first lower insulating layer may have a refractive index different from a refractive index of the second lower insulating layer.

The first lower insulating layer may include silicon oxide ($SiO_x$), and the second lower insulating layer may include amorphous silicon (a-Si).

The display panel further may include a first sub-barrier layer disposed between the substrate and the at least one lower insulating layer; and a second sub-barrier layer disposed between the first sub-barrier layer and the at least one lower insulating layer, and the first sub-barrier layer and the second sub-barrier layer may be disposed in both the first area and the second area of the display panel.

The display panel further may include a rear surface light blocking layer disposed in the second sub-barrier layer, and the rear surface light blocking layer may be disposed in the second area of the display panel.

The substrate may include a first sub-base layer; a first intermediate barrier layer disposed on the first sub-base layer; a second intermediate barrier layer disposed on the first intermediate barrier layer, and a second sub-base layer disposed on the second intermediate barrier layer, and the first intermediate barrier layer may have a refractive index between a refractive index of the first sub-base layer and a refractive index of the second intermediate barrier layer.

A refractive index of the first sub-barrier layer may be between a refractive index of the second sub-base layer and a refractive index of the second sub-barrier layer.

The first sub-base layer and the second sub-base layer may include a polyimide-based resin, the first sub-barrier layer and the first intermediate barrier layer include silicon oxynitride (SiON), and the second sub-barrier layer and the second intermediate barrier layer include silicon oxide ($SiO_x$).

The display panel further may include a buffer layer disposed on the second sub-barrier layer to that overlaps the at least one lower insulating layer and the light blocking layer.

The buffer layer may include a first sub-buffer layer; and a second sub-buffer layer disposed on the first sub-buffer layer, and a portion of the second sub-buffer layer disposed in the element area of the display panel may have a thickness greater than a thickness of a portion of the second sub-buffer layer disposed in the transmission area of the display panel.

The buffer layer may include a first sub-buffer layer; and a second sub-buffer layer disposed on the first sub-buffer layer, and a portion of the second sub-buffer layer disposed in the transmission area of the display panel may be removed.

The display panel further may include insulating layers disposed on the light blocking layer, a number of insulating layers of the insulating layers may include a third opening, and a minimum width of the third opening may be less than a minimum width of the first opening of the light blocking layer.

The insulating layers may include an organic layer overlapping the third opening of the number of insulating layers.

The organic layer may include a polyimide-based resin.

Each of the light emitting elements may include a pixel electrode; a light emitting layer disposed on the pixel electrode; and a common electrode disposed on the light emitting layer, the common electrode including an opening overlapping the first opening in a plan view, and a minimum width of the opening may be greater than a minimum width of the first opening of the light blocking layer.

Each of the light emitting elements further may include a first functional layer disposed between the pixel electrode and the light emitting layer; and a second functional layer disposed between the light emitting layer and the common electrode, and the first functional layer and the second functional may overlap an area overlapping the first opening of the light blocking layer.

The pixel electrode of each of the light emitting elements may be disposed in the element area or the second area of the display panel.

The display panel further may include a sensor layer disposed on the encapsulation layer; the sensor layer may include a sensor base layer disposed on the encapsulation layer; a first sensor conductive layer disposed on the sensor base layer; a sensor insulating layer disposed on the first sensor conductive layer; a second sensor conductive layer disposed on the sensor insulating layer; and a sensor cover layer overlapping the second sensor conductive layer, and the sensor base layer, the sensor insulating layer, and the sensor cover layer may overlap an area overlapping the first opening of the light blocking layer.

The display panel further may include an anti-reflective layer disposed on the sensor layer, and the anti-reflective layer may include a division layer including division openings that overlap the light emitting elements, respectively, and color filters respectively corresponding to the division openings of the division layer.

The division layer may include an opening defined that overlaps the first opening of the light blocking layer, and a minimum width of the opening of the division layer may be greater than a minimum width of the first opening of the light blocking layer.

Embodiments provide a display panel including a substrate; a light blocking layer disposed on the substrate, the light blocking layer including a first opening; a circuit layer disposed on the light blocking layer, the circuit layer including insulating layers and conductive layers; a light emitting element layer disposed on the circuit layer, the light emitting element layer including light emitting layers disposed in an area spaced apart from the first opening of the light blocking layer in a plan view; and an encapsulation layer overlapping the light emitting element layer. A number of insulating layers of the insulating layers may include a second opening that overlaps the first opening of the light blocking layer, and a second sidewall of the number of insulating layers may protrude more than a first sidewall of the light blocking layer defining the first opening of the light blocking layer.

The insulating layers include an organic layer overlapping the second opening of the number of insulating layers.

The display panel further may include at least one lower insulating layer disposed between the light blocking layer and the substrate; the at least one lower insulating layer may include a third opening that overlaps the first opening of the light blocking layer, and the first sidewall may be aligned with a third sidewall of the at least one lower insulating layer defining the third opening of the at least one lower insulating layer.

The at least one lower insulating layer may include a first lower insulating layer disposed between the substrate and the light blocking layer; and a second lower insulating layer disposed between the first lower insulating layer and the substrate, and the first lower insulating layer may have a refractive index different from a refractive index of the second lower insulating layer.

The display panel further may include a first sub-barrier layer disposed between the substrate and the lower insulating layer; and a second sub-barrier layer disposed between the first sub-barrier layer and the at least one lower insulating layer.

The substrate may include a first sub-base layer; a first intermediate barrier layer disposed on the first sub-base layer, a second intermediate barrier layer disposed on the first intermediate barrier layer; and a second sub-base layer disposed on the second intermediate barrier layer; and the first intermediate barrier layer may have a refractive index between a refractive index of the first sub-base layer and a refractive index of the second intermediate barrier layer.

A refractive index of the first sub-barrier layer may be between a refractive index of the second sub-base layer and a refractive index of the second sub-barrier layer.

Embodiments provide a display panel that may include a substrate; at least one lower insulating layer disposed on the substrate; a light blocking layer disposed on the at least one lower insulating layer; insulating layers disposed above the light blocking layer; pixel circuits disposed above the light blocking layer; light emitting elements electrically connected to the pixel circuits; and an encapsulation layer overlapping the light emitting elements. The at least one lower insulating layer and the light blocking layer may include an opening, and the pixel circuits may be spaced apart from the opening in a plan view.

The at least one lower insulating layer may include a first lower insulating layer disposed between the substrate and the light blocking layer; and a second lower insulating layer disposed between the first lower insulating layer and the substrate, the first lower insulating layer may have a refractive index different from a refractive index of the second lower insulating layer, the first lower insulating layer may include silicon oxide ($SiO_x$), and the second lower insulating layer may include amorphous silicon (a-Si).

The substrate may include a first sub-base layer; a first intermediate barrier layer disposed on the first sub-base layer; a second intermediate barrier layer disposed on the first intermediate barrier layer, and a second sub-base layer disposed on the second intermediate barrier layer, and the first intermediate barrier layer may have a refractive index between a refractive index of the first sub-base layer and a refractive index of the second intermediate barrier layer.

The display panel further may include a first sub-barrier layer disposed between the substrate and the lower insulating layer; and a second sub-barrier layer disposed between the first sub-barrier layer and the lower insulating layer, wherein the first sub-barrier layer may have a refractive index between a refractive index of the second sub-base layer and a refractive index of the second sub-barrier layer.

The display panel further may include a buffer layer disposed on the second sub-barrier layer that overlaps the at least one lower insulating layer and the light blocking layer. The buffer layer may include a first sub-buffer layer and a second sub-buffer layer disposed on the first sub-buffer layer, and a portion of the second sub-buffer layer, that overlaps the opening may be removed.

The display panel further may include inorganic layers disposed on the light blocking layer and an organic layer disposed on the inorganic layers. The inorganic layers may include an insulating opening that overlaps the opening, and the organic layer may overlap the insulating opening.

According to the above, the transmission area may be defined by the opening of the light blocking layer, and at least one lower insulating layer may be disposed under or below the light blocking layer. The at least one lower insulating layer reduces a reflection of the light by the light blocking layer. Thus, a probability of a noise image occurrence, for example, a ghost phenomenon, in an image acquired by the electronic module is reduced or eliminated.

The display panel may include the first sub-barrier layer and the second sub-barrier layer, sequentially disposed on the substrate, and the refractive index of the first sub-barrier may be between the refractive index of the substrate and the refractive index of the second sub-barrier layer. As a difference in refractive index between layers contacting each other decreases, a reflection of the light at an interface between the layers contacting each other may be reduced. As a result, the transmittance of the light passing through the transmission area may be improved.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1A:
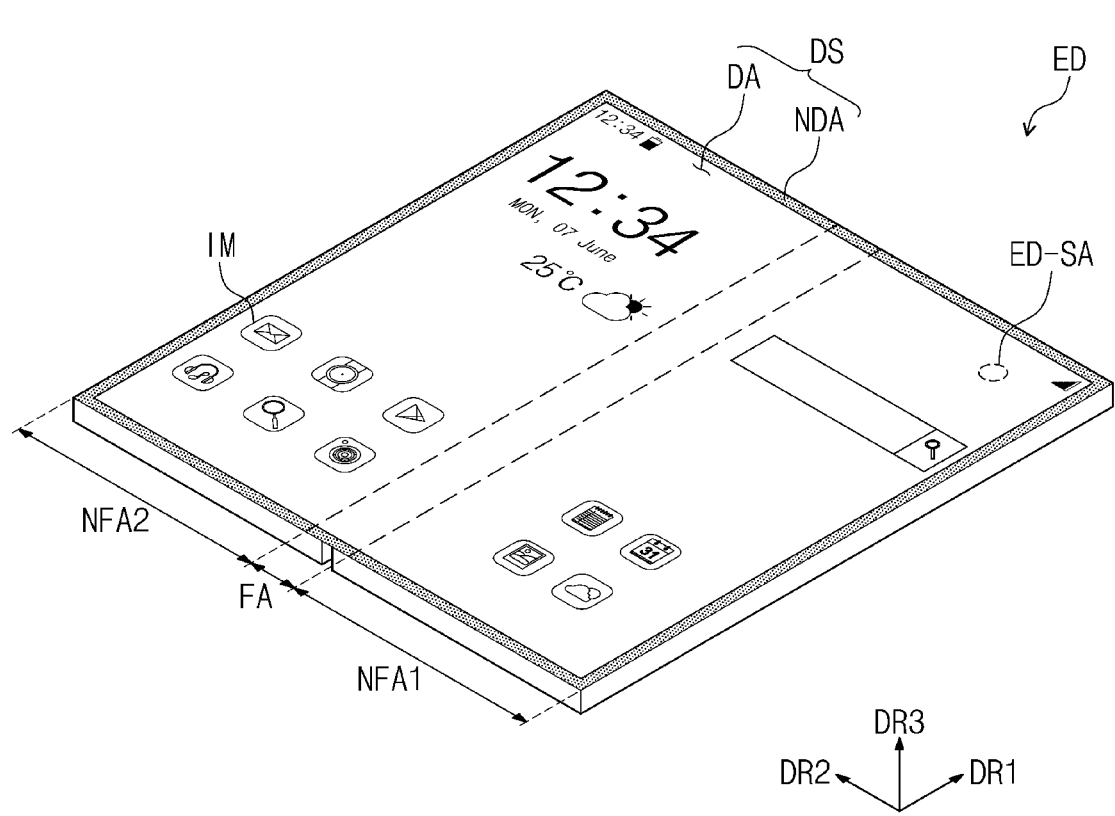
FIGS. 1A and 1B are schematic perspective views showing an electronic device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the disclosure, it will be understood that when an element or layer is referred to as being "on", "connected to" or "coupled to" another element or layer, it can be directly on, connected or coupled to the other element or layer or intervening elements or layers may be present.

It will be understood that the terms "connected to" or "coupled to" may include a physical or electrical connection or coupling.

Like numerals refer to like elements throughout. In the drawings, the thickness, ratio, and dimension of components may be exaggerated for effective description of the technical content.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure.

As used herein, the singular forms, "a", "an" and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Spatially relative terms, such as "beneath", "below", "lower", "above", "upper" and the like, may be used herein for ease of description to describe one element or feature's relationship to another element(s) or feature(s) as illustrated in the figures but are not limited to that which is illustrated in the figures.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms comprises," "comprising," "includes," and/or "including,", "has," "have," and/or "having," and variations thereof when used in this specification, specify the presence of stated features, integers, steps, operations, elements, and/or components, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the disclosure will be explained in detail with reference to the accompanying drawings.

Figure 1B:
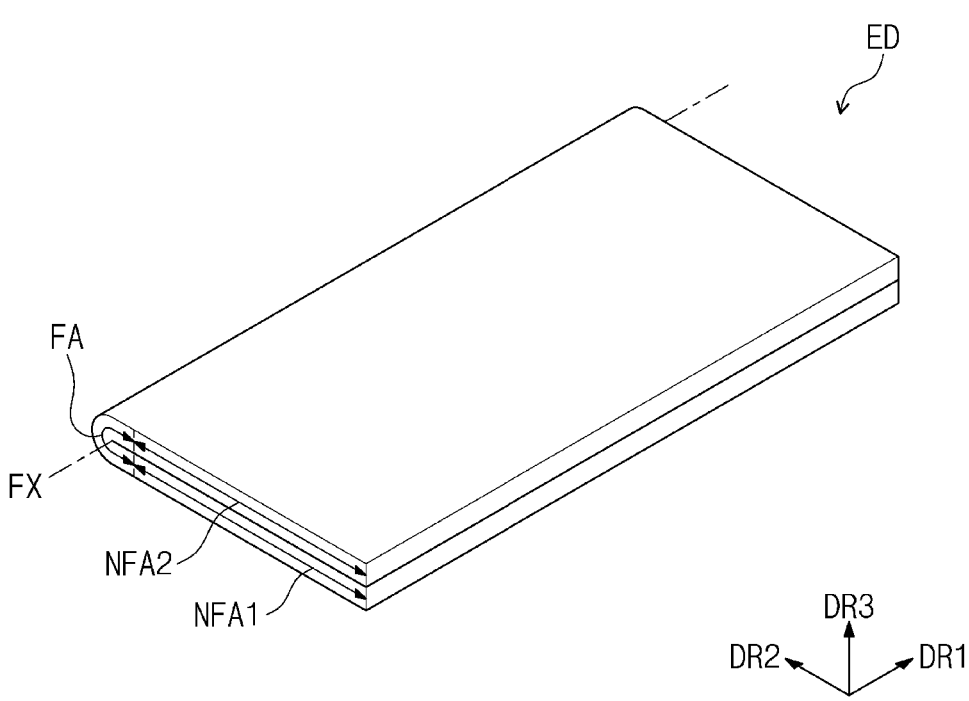

FIGS. 1A and 1B are schematic perspective views showing an electronic device ED according to an embodiment. FIG. 1A shows an unfolded state of the electronic device ED, and FIG. 1B shows a folded state of the electronic device ED.

Referring to FIGS. 1A and 1B, the electronic device ED may include a display surface DS defined by a first direction DR1 and a second direction DR2 crossing or intersecting the first direction DR1. The electronic device ED may provide an image IM to a user through the display surface DS.

The display surface DS may include a display area DA and a non-display area NDA around the display area DA. The display area DA may display the image IM, and the non-display area NDA may not display the image IM. The non-display area NDA may surround or may be adjacent to the display area DA, however, it should not be limited thereto or thereby, and the shape of the display area DA and the shape of the non-display area NDA may be changed.

Hereinafter, a direction substantially perpendicular to a plane defined by the first direction DR1 and the second direction DR2 may be referred to as a third direction DR3. In the disclosure, the expression "when viewed in a plan view" may mean a state of being viewed in the third direction DR3.

A sensing area ED-SA may be defined in the display area DA of the electronic device ED. FIG. 1A shows one sensing area ED-SA as a representative example, however, the number of the sensing areas ED-SA should not be limited thereto or thereby. The sensing area ED-SA may be a portion of the display area DA. Accordingly, the electronic device ED may display the image through the sensing area ED-SA.

The electronic device ED may include an electronic module disposed in an area overlapping the sensing area ED-SA. The electronic module may receive an external input provided from the outside through the sensing area ED-SA or may output a signal through the sensing area ED-SA. As an example, the electronic module may be a camera module, a sensor that measures a distance, such as a proximity sensor, a sensor that recognizes a part of a user's body, for example, a fingerprint, an iris, or a face, or a small lamp that outputs a light, however, it should not be particularly limited. Hereinafter, the camera module will be described as the electronic module overlapping the sensing area ED-SA.

The electronic device ED may include a folding area FA and non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2 in the second direction DR2. The folding area FA may be referred to as a foldable area, and the first and second non-folding areas NFA1 and NFA2 may be referred to as first and second non-foldable areas, respectively.

As shown in FIG. 1B, the folding area FA may be folded with respect to a folding axis FX substantially parallel to the first direction DR1. The folding area FA may have a curvature and a radius of curvature in case that the electronic device ED is in the folded state. The electronic device ED may be inwardly folded (inner-folding) such that the first non-folding area NFA1 faces the second non-folding area NFA2 and the display surface DS is not exposed to the outside.

According to an embodiment, the electronic device ED may be outwardly folded (outer-folding) such that the display surface DS is exposed to the outside. According to an embodiment, the electronic device ED may be provided such that both the inner-folding operation and the outer-folding operation are possible from an unfolding operation. According to an embodiment, the electronic device ED may be provided to carry out any one of the unfolding operation, the inner-folding operation, and the outer-folding operation.

FIGS. 1A and 1B show the foldable electronic device ED as a representative example, however, the disclosure should not be limited to the foldable electronic device ED. As an example, the disclosure may be applied to a rigid electronic device, for example, an electronic device that does not include the folding area FA.

Figure 2A:
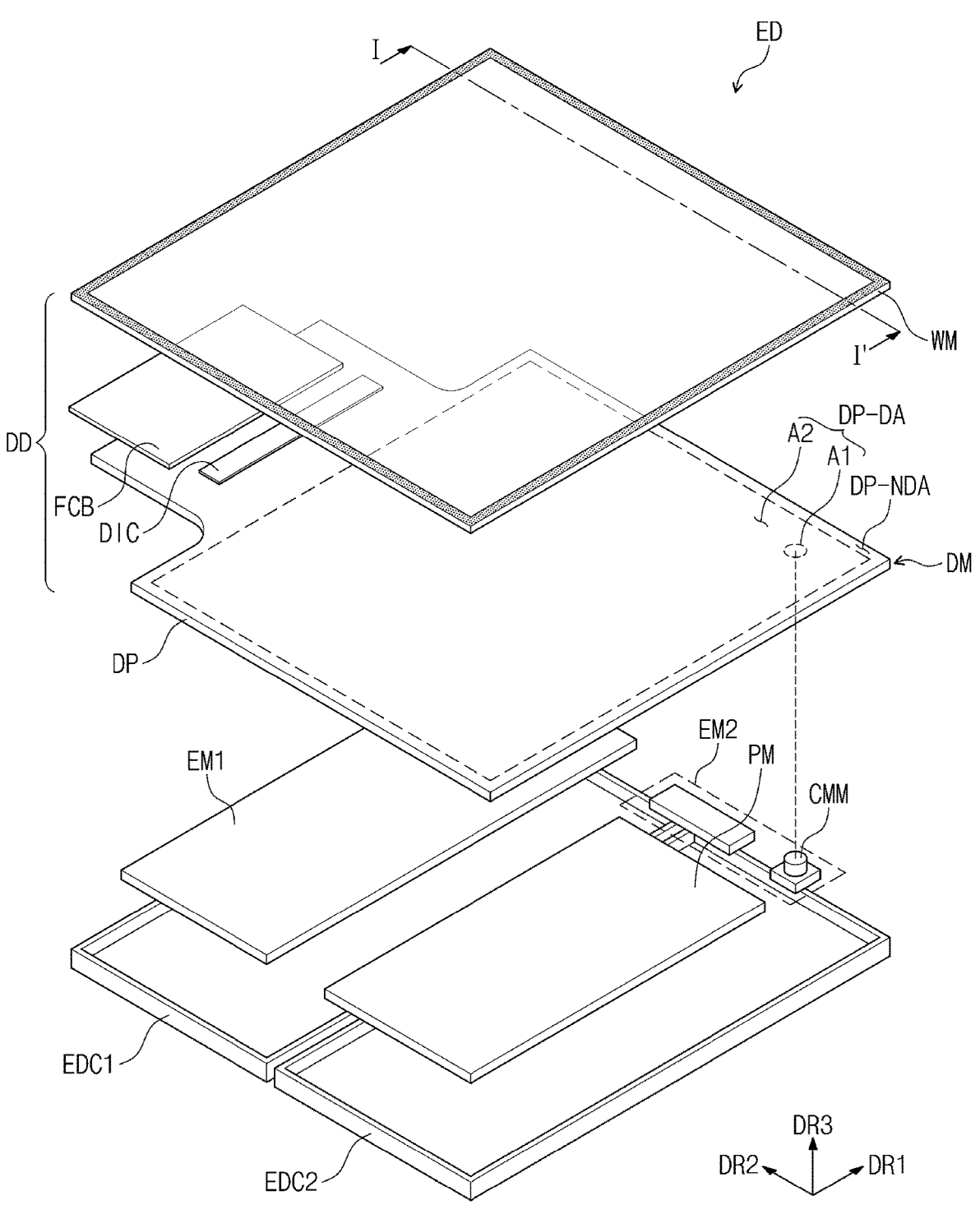
FIG. 2A is an exploded perspective view showing an electronic device according to an embodiment.
Figure 2B:
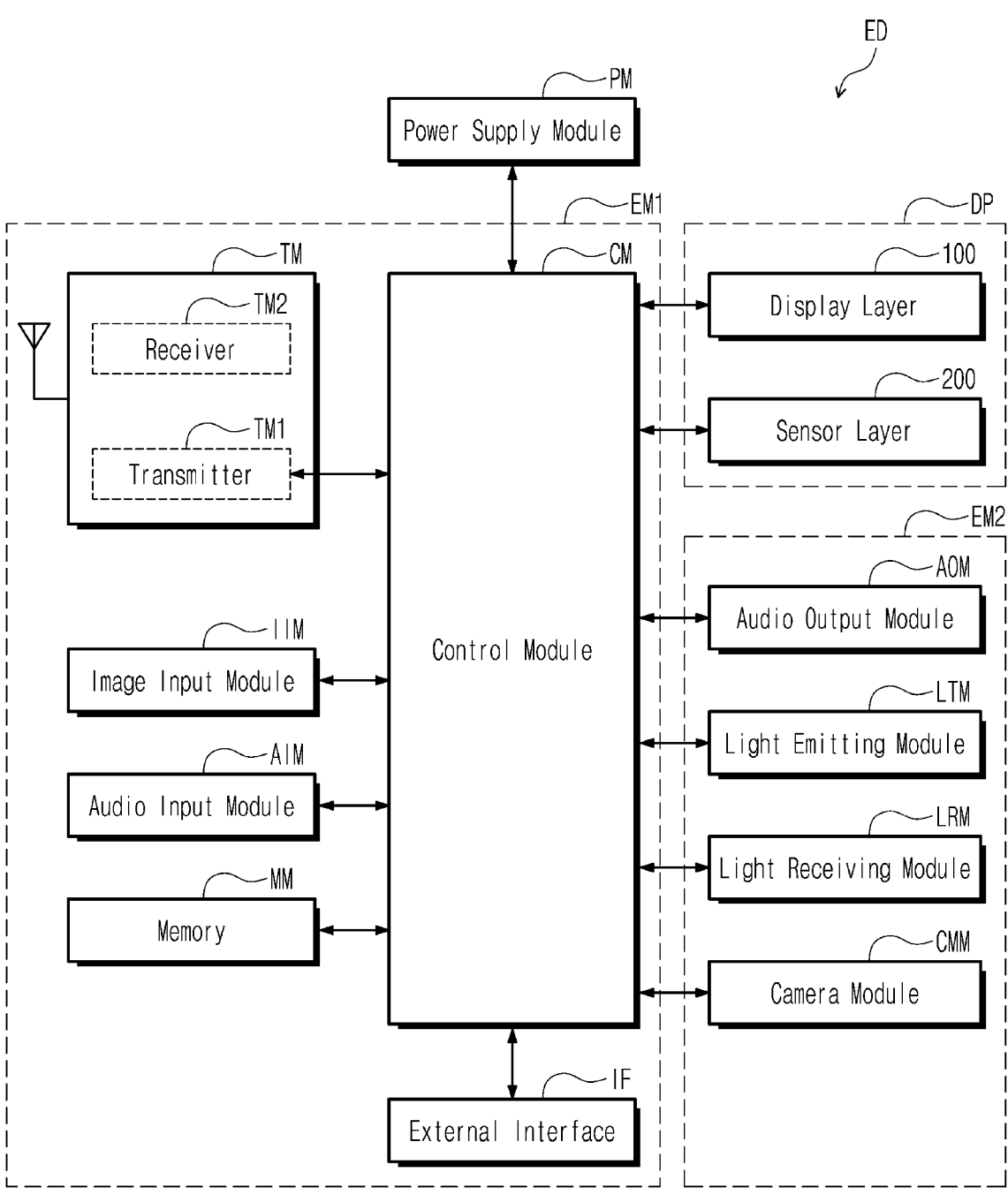
FIG. 2B is a block diagram showing an electronic device according to an embodiment.

FIG. 2A is an exploded perspective view showing the electronic device ED according to an embodiment. FIG. 2B is a block diagram showing the electronic device ED according to an embodiment.

Referring to FIGS. 2A and 2B, the electronic device ED may include a display device DD, a first electronic module EM1, a second electronic module EM2, a power supply module PM, and housings EDC1 and EDC2. Although not shown in figures, the electronic device ED may further include a mechanical structure to control a folding operation of the display device DD.

The display device DD may include a window module WM and a display module DM. The window module WM may provide a front surface of the electronic device ED. The display module DM may include at least a display panel DP. The display module DM may generate the image and may sense an external input.

Although the display module DM is shown to be the same as the display panel DP in FIG. 2A, however, the display module DM may be a stack structure in which plural components including the display panel DP may be stacked each other. Detailed descriptions on the stack structure of the display module DM will be described later.

The display panel DP may include a display area DP-DA and a non-display area DP-NDA, which respectively correspond to the display area DA (refer to FIG. 1A) and the non-display area NDA (refer to FIG. 1A) of the electronic device ED. In the disclosure, the expression "an area/portion corresponds to another area/portion" means that "an area/portion overlaps another area/portion", however, the "areas and portions" should not be limited to have the same size as each other.

The display area DP-DA may include a first area A1 and a second area A2. The first area A1 may overlap or correspond to the sensing area ED-SA (refer to FIG. 1A) of the electronic device ED. In an embodiment, the first area A1 is shown as a circular shape, however, the shape of the first area A1 should not be limited thereto or thereby. The first area A1 may have a variety of shapes, such as a polygonal shape, an oval shape, a figure having at least one curved side, or an irregular shape. The first area A1 may be referred to as a component area, and the second area A2 may be referred to as a main display area or a normal display area. Furthermore, it is to be understood that the shapes disclosed herein may include shapes substantially identical or similar to the shapes.

The first area A1 may have a transmittance higher than that of the second area A2. The first area A1 may have a resolution lower than that of the second area A2. The first area A1 may overlap a camera module CMM described later.

The display panel DP may include a display layer 100 and a sensor layer 200.

The display layer 100 may have a configuration that substantially generates the image. The display layer 100 may be a light emitting type display layer. For example, the display layer 100 may be an organic light emitting display layer, an inorganic light emitting display layer, an organic-inorganic light emitting display layer, a quantum dot display layer, a micro-LED display layer, or a nano-LED display layer.

The sensor layer 200 may sense an external input applied thereto from the outside. For example, the external input may be a user input. The user input may include a variety of external inputs, such as a part of user's body, light, heat, pen, or pressure.

The display module DM may include a driving chip DIC disposed in the non-display area DP-NDA. The display module DM may further include a flexible circuit film FCB connected or coupled with the non-display area DP-NDA.

The driving chip DIC may include driving elements to drive pixels of the display panel DP, for example, a data driving circuit. FIG. 2A shows a structure in which the driving chip DIC is mounted on the display panel DP, however, the disclosure should not be limited thereto or thereby. As an example, the driving chip DIC may be mounted on the flexible circuit film FCB.

The power supply module PM may supply a power source necessary for an overall operation of the electronic device ED. The power supply module PM may include a battery module.

The first electronic module EM1 and the second electronic module EM2 may include a variety of functional modules to drive the electronic device ED. Each of the first electronic module EM1 and the second electronic module EM2 may be mounted on or directly mounted on a mother board, which may be electrically connected to the display panel DP, or may be electrically connected to the mother board via a connector (not shown) after being mounted on a separate substrate.

The first electronic module EM1 may include a control module CM, a wireless communication module TM, an image input module IIM, an audio input module AIM, a memory MM, and an external interface IF.

The control module CM may control an overall operation of the electronic device ED. The control module CM may be, but not limited to, a microprocessor. For example, the control module CM may activate or deactivate the display panel DP. The control module CM may control other modules, such as the image input module IIM or the audio input module AIM, based on a touch signal provided from the display panel DP.

The wireless communication module TM may communicate with an external electronic device through a first network, for example, a short-range communication network such as Bluetooth, WiFi direct, or infrared data association (IrDA), or a second network, for example, a long-range communication network such as a cellular network, an internet, or a computer network (for example, LAN or WAN). Communication modules included in the wireless communication module TM may be integrated into one component, for example, a single chip, or may be implemented as components separated from each other, for example, chips. The wireless communication module TM may transmit or receive a voice signal using a general communication line. The wireless communication module TM may include a transmitter TM1 that modulates a signal to be transmitted and transmits the modulated signal and a receiver TM2 that demodulates a signal applied thereto.

The image input module IIM may process an image signal and may convert the image signal into image data that may be displayed through the display panel DP. The audio input module AIM may receive an external sound signal through a microphone in a record mode or a voice recognition mode and may convert the external sound signal to electrical voice data.

The external interface IF may include a connector that physically connects the electronic device ED to an external electronic device. For example, the external interface IF may serve as an interface between the control module CM and external devices, such as an external charger, a wired or wireless data port, a card socket (for example, a memory card and a SIM or UIM card), etc. within the spirit and the scope of the disclosure.

The second electronic module EM2 may include an audio output module AOM, a light emitting module LTM, a light receiving module LRM, and the camera module CMM. The audio output module AOM may convert audio data provided from the wireless communication module TM or audio data stored in the memory MINI and may output the converted audio data to the outside.

The light emitting module LTM may generate and emit a light. The light emitting module LTM may emit an infrared light. The light emitting module LTM may include an LED element. The light receiving module LRM may sense the infrared light. The light receiving module LRM may be activated in case that the infrared light above a level is sensed. The light receiving module LRM may include a CMOS sensor. The infrared light generated and emitted from the light emitting module LTM may be reflected by an external object, for example, a user's finger or face, and the reflected infrared light may be incident into the light receiving module LRM.

The camera module CMM may take a photo or video. The camera module CMM may be provided or disposed in plural. Among them, some or a number of camera modules CMM may overlap the first area A1. The external input, for example, a light, may be provided to the camera module CMM via the first area A1. As an example, the camera module CMM may receive a natural light through the first area A1 to take a picture of an external object.

The housings EDC1 and EDC2 may accommodate the display module DM, the first and second electronic modules EM1 and EM2, and the power supply module PM. The housings EDC1 and EDC2 may protect components accommodated therein, for example, the display module DM, the first and second electronic modules EM1 and EM2, and the power supply module PM. FIG. 2A shows two housings EDC1 and EDC2 separated from each other as a representative example, however, the disclosure should not be limited thereto or thereby. Although not shown in figures, the electronic device ED may further include a hinge structure to connect the two housings EDC1 and EDC2. The housings EDC1 and EDC2 may be connected or coupled with the window module WM.

Figure 3:
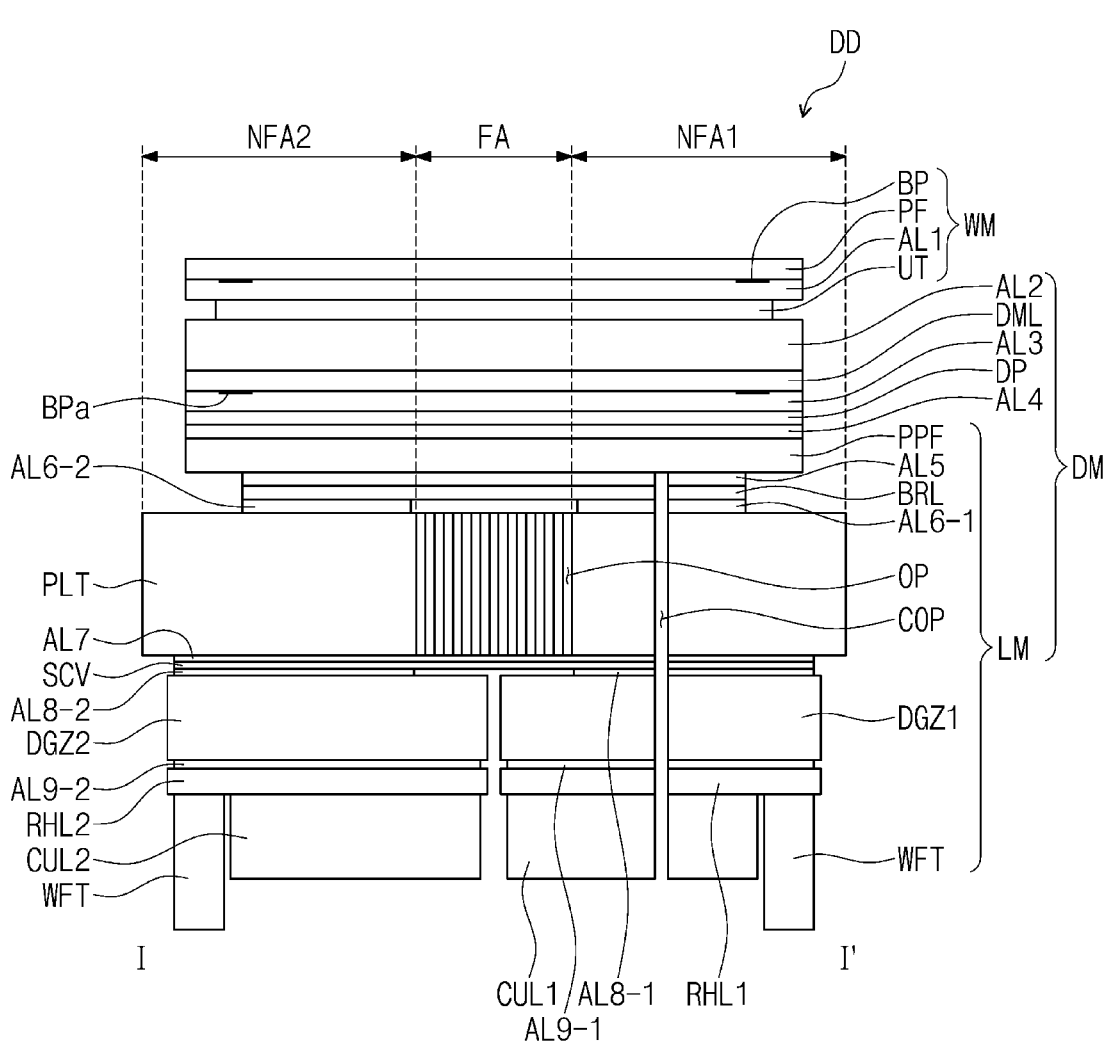
FIG. 3 is a schematic cross-sectional view taken along line I-I' of FIG. 2A to show a display device according to an embodiment.
Figure 3:
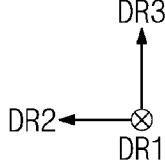

FIG. 3 is a schematic cross-sectional view taken along line I-I' of FIG. 2A to show the display device DD according to an embodiment.

Referring to FIG. 3, the display device DD may include the window module WM and the display module DM.

The window module WM may include a window UT, a protective film PF disposed on the window UT, and a bezel pattern BP.

The window UT may be a chemically strengthened glass. As the window UT is applied to the display device DD, the occurrence of crease may be minimized even though the folding and unfolding operations are repeatedly performed.

The protective film PF may include polyimide, polycarbonate, polyamide, triacetylcellulose, polymethylmethacrylate, or polyethylene terephthalate. Although not shown in figures, at least one of a hard coating layer, an anti-fingerprint layer, and an anti-reflective layer may be disposed on an upper surface of the protective film PF.

The bezel pattern BP may overlap the non-display area NDA shown in FIG. 1A. The bezel pattern BP may be disposed on one surface of the window UT or one surface of the protective film PF. FIG. 3 shows the structure in which the bezel pattern BP is disposed on a lower surface of the protective film PF, however, it should not be limited thereto or thereby. According to an embodiment, the bezel pattern BP may be disposed on an upper surface of the protective film PF, an upper surface of the window UT, or a lower surface of the window UT. The bezel pattern BP may be a colored light blocking layer and may be formed by a coating process. The bezel pattern BP may include a base material and a pigment or a dye mixed with the base material. The bezel pattern BP may have a closed line shape when viewed in a plan view.

A first adhesive layer AL1 may be disposed between the protective film PF and the window UT. The first adhesive layer AL1 may be a pressure sensitive adhesive (PSA) film or an optically clear adhesive (OCA). Adhesive layers described hereinafter may include the same adhesive as the first adhesive layer AL1 and may include a conventional adhesive.

The first adhesive layer AL1 may have a thickness enough to cover or overlap the bezel pattern BP. As an example, the bezel pattern BP may have a thickness from about 3 micrometers to about 8 micrometers, and the first adhesive layer AL1 may have a thickness enough to prevent air bubbles from occurring around the bezel pattern BP.

The first adhesive layer AL1 may be separated from the window UT. Since a strength of the protective film PF is lower than that of the window UT, scratches may occur relatively readily on the protective film PF. After the first adhesive layer AL1 and the protective film PF are separated from the window UT, another protective film PF may be attached to the window UT.

The display module DM may include an impact absorbing layer DML, the display panel DP, and a lower member LM.

The impact absorbing layer DML may be disposed above the display panel DP. The impact absorbing layer DML may be a functional layer to protect the display panel DP from the external impact. The impact absorbing layer DML may be connected or coupled with the window UT by a second adhesive layer AL2 and may be connected or coupled with the display panel DP by a third adhesive layer AL3.

An additional bezel pattern BPa may overlap the non-display area NDA shown in FIG. 1A. The additional bezel pattern BPa may be disposed on one surface of the impact absorbing layer DML. FIG. 3 shows the structure in which the additional bezel pattern BPa is disposed on a lower surface of the impact absorbing layer DML as a representative example. The additional bezel pattern BPa may include a same material or a similar material as that of the bezel pattern BP described above. According to an embodiment, the additional bezel pattern BPa may be omitted.

The lower member LM may be disposed under or below the display panel DP. The lower member LM may be connected or coupled with the display panel DP by a fourth adhesive layer AL4. The lower member LM may include a panel protective layer PPF, a barrier layer BRL, a support layer PLT, a cover layer SCV, a first digitizer DGZ1, a second digitizer DGZ2, a first lower plate RHL1, a second lower plate RHL2, a first cushion layer CUL1, a second cushion layer CUL2, and a waterproof tape WFT. According to an embodiment, the lower member LM may not include some or a number of the above-mentioned components or may further include other components. The stacking order shown in FIG. 3 is merely one example, and the stacking order of the components may be changed.

The panel protective layer PPF may be disposed under or below the display panel DP. The fourth adhesive layer AL4 may attach the panel protective layer PPF to the display panel DP. The panel protective layer PPF may protect a lower portion of the display panel DP. The panel protective layer PPF may include a flexible plastic material. The panel protective layer PPF may prevent scratches from occurring on a rear surface of the display panel DP during a manufacturing process of the display panel DP. The panel protective layer PPF may be a colored polyimide film. For example, the panel protective layer PPF may be an opaque yellow film, however, it should not be limited thereto or thereby.

The barrier layer BRL may be disposed under or below the panel protective layer PPF. A fifth adhesive layer AL5 may be disposed between the panel protective layer PPF and the barrier layer BRL and may attach the barrier layer BRL to the panel protective layer PPF. The barrier layer BRL may increase a resistance against a compressive force caused by an external pressure force. Accordingly, the barrier layer BRL may prevent the display panel DP from being deformed. The barrier layer BRL may include a flexible plastic material, such as polyimide or polyethylene terephthalate.

The barrier layer BRL may absorb a light incident thereto from the outside. The barrier layer BRL may include a light blocking material or may be a colored film with low light transmittance. As an example, the barrier layer BRL may be a black plastic film, for example, a black polyimide film. In case that looking at the display module DM from an upper side of the window module WM, components disposed under or below the barrier layer BRL may not be viewed by the user.

The support layer PLT may be disposed under or below the barrier layer BRL. The support layer PLT may support components disposed on the support layer PLT and may maintain the unfolded state and the folded state of the display device DD. According to an embodiment, the support layer PLT may include a first support portion corresponding to the first non-folding area NFA1, a second support portion corresponding to the second non-folding area NFA2, and a folding portion corresponding to the folding area FA. The first support portion and the second support portion may be spaced apart from each other in the second direction DR2. The folding portion may be disposed between the first support portion and the second support portion and may be provided with openings OP defined therethrough. Due to the openings OP, a flexibility of a portion of the folding portion may be improved.

The support layer PLT may include a carbon fiber reinforced plastic (CFRP), however, it should not be limited thereto or thereby. The first and second support portions may include a non-metallic material, a plastic material, a glass fiber reinforced plastic, or a glass material. The plastic material may include polyimide, polyethylene, or polyethylene terephthalate, however, it should not be particularly limited. The first support portion and the second support portion may include a same material or a similar material as each other. The folding portion may include a same material or a similar material as that of the first support portion and the second support portion or may include a different material from that of the first support portion and the second support portion. As an example, the folding portion may include a material having an elastic modulus equal to or greater than about 60 GPa and may include a metal material such as a stainless steel. For example, the folding portion may include SUS 304, however, it should not be limited thereto or thereby. The folding portion may include a variety of metal materials.

A sixth adhesive layer AL6-1 and AL6-2 may be disposed between the barrier layer BRL and the support layer PLT. The sixth adhesive layer AL6-1 and AL6-2 may attach the barrier layer BRL to the support layer PLT. When viewed in a plan view, the sixth adhesive layer AL6-1 and AL6-2 may not overlap the openings OP. The sixth adhesive layer AL6-1 and AL6-2 may be spaced apart from the openings OP in a plane.

The sixth adhesive layer AL6-1 and AL6-2 may include a first portion AL6-1 and a second portion AL6-2 spaced apart from the first portion AL6-1. The first portion AL6-1 and the second portion AL6-2 may be spaced apart from each other such that the openings OP are interposed between the first portion AL6-1 and the second portion AL6-2 when viewed in the plane. The first portion AL6-1 may overlap the first non-folding area NFA1, the second portion AL6-2 may overlap the second non-folding area NFA2, and each of the first portion AL6-1 and the second portion AL6-2 may not overlap the folding area FA. As the sixth adhesive layer AL6-1 and AL6-2 is not disposed in an area overlapping the folding area FA, a flexibility of the support layer PLT may be improved.

In the area overlapping the folding area FA, the barrier layer BRL may be spaced apart from the support layer PLT. For example, an empty space may be defined between the support layer PLT and the barrier layer BRL in the area overlapping the folding area FA.

Since the empty space is defined between the barrier layer BRL and the support layer PLT in case that the electronic device ED (refer to FIG. 1A) is folded, the openings OP defined through the support layer PLT may not be viewed from the outside of the electronic device ED (refer to FIG. 1A).

Since the barrier layer BRL may include the light blocking material or may be the colored film with low light transmittance, a color difference between areas of the support layer PLT may not be viewed from the outside. As an example, a color difference between a first support area of the support layer PLT through which the openings OP are defined and a second support area of the support layer PLT through which the openings OP are not defined may not be viewed from the outside. The first support area may overlap the folding area FA, and the second support area may overlap the first non-folding area NFA1 and the second non-folding area NFA2.

The sixth adhesive layer AL6-1 and AL6-2 may have a thickness smaller than a thickness of the fifth adhesive layer AL5. As an example, the thickness of the fifth adhesive layer AL5 may be about 25 micrometers, and the thickness of the sixth adhesive layer AL6-1 AND AL6-2 may be about 16 micrometers.

As the thickness of the sixth adhesive layer AL6-1 AND AL6-2 decreases, a step difference caused by the sixth adhesive layer AL6-1 AND AL6-2 may decrease. In case that the step difference decreases, there is an advantage in that a deformation of the stack structure due to the folding and unfolding operations of the electronic device ED (refer to FIG. 1A) may be reduced, but the openings OP may be viewed or the sixth adhesive layer AL6-1 AND AL6-2 may be separated due to the repeated folding operations. As the thickness of the sixth adhesive layer AL6-1 AND AL6-2 increases, the openings OP may not be viewed and reliability with respect to an adhesive force of the sixth adhesive layer AL6-1 AND AL6-2 may be improved in spite of the repeated folding operations. However, the step difference may increase. Accordingly, the thickness of the sixth adhesive layer AL6-1 AND AL6-2 may be determined within an appropriate range in consideration of a folding reliability, an adhesion reliability, and a visibility of the openings OP.

A seventh adhesive layer AL7 may be disposed under or below the support layer PLT, and the cover layer SCV may be disposed under or below the seventh adhesive layer AL7. The support layer PLT may be connected or coupled with the cover layer SCV by the seventh adhesive layer AL7. The cover layer SCV may be manufactured in the form of a sheet and may be attached to the support layer PLT.

The seventh adhesive layer AL7 and the cover layer SCV may cover or overlap the openings OP defined through the support layer PLT. Accordingly, the cover layer SCV may prevent a foreign substance from entering the openings OP. The cover layer SCV may have an elastic modulus smaller than that of the support layer PLT. As an example, the cover layer SCV may include thermoplastic polyurethane, rubber, or silicone, however, it should not be limited thereto or thereby.

An eighth adhesive layer AL8-1 and AL8-2 may be disposed under or below the cover layer SCV. The eighth adhesive layer AL8-1 and AL8-2 may include a first portion AL8-1 and a second portion AL8-2. The first portion AL8-1 and the second portion AL8-2 may be spaced apart from each other. The first portion AL8-1 and the second portion AL8-2 may be spaced apart from each other such that the openings OP are interposed between the first portion AL8-1 and the second portion AL8-2 when viewed in the plane. The first portion AL8-1 and the second portion AL8-2 may not overlap the folding area FA.

The first digitizer DGZ1 and the second digitizer DGZ2 may be disposed respectively under or below the first portion AL8-1 and the second portion AL8-2. The first digitizer DGZ1 may be attached to the first portion AL8-1, and the second digitizer DGZ2 may be attached to the second portion AL8-2. The first digitizer DGZ1 and the second digitizer DGZ2 may be spaced apart from each other by a gap. The gap may be defined to correspond to the folding area FA. When viewed in a plan view, a portion of the first digitizer DGZ1 may overlap a portion of the openings OP, and a portion of the second digitizer DGZ2 may overlap another portion of the openings OP.

Each of the first digitizer DGZ1 and the second digitizer DGZ2 may include loop coils generating a magnetic field with an electronic pen at a resonant frequency. The first digitizer DGZ1 and the second digitizer DGZ2 may be called an EMR sensing panel.

The magnetic field generated by the first digitizer DGZ1 and the second digitizer DGZ2 may be applied to an LC resonant circuit formed by an inductor (coil) and a capacitor of the electronic pen. The coil may generate a current in response to the magnetic field applied thereto and may supply the generated current to the capacitor. Accordingly, the capacitor may be charged with the current supplied thereto from the coil and may discharge the charged current to the coil. Consequently, the magnetic field of the resonant frequency may be emitted from the coil. The magnetic field emitted by the electronic pen may be absorbed by the loop coils of the digitizer, and thus, it is possible to determine a position in the first digitizer DGZ1 and the second digitizer DGZ2 to which the electronic pen gets close.

A ninth adhesive layer AL9-1 and AL9-2 may be disposed under or below the first digitizer DGZ1 and the second digitizer DGZ2. The ninth adhesive layer AL9-1 and AL9-2 may include a first portion AL9-1 and a second portion AL9-2. The first portion AL9-1 and the second portion AL9-2 may be spaced apart from each other.

A first lower plate RHL1 and a second lower plate RHL2 may be disposed under or below the first portion AL9-1 and the second portion AL9-2, respectively. The first lower plate RHL1 and the second lower plate RHL2 may protect components disposed thereabove from an external pressure. The first lower plate RHL1 and the second lower plate RHL2 may include SUS 316, however, it should not be particularly limited.

The first cushion layer CUL1 and the second cushion layer CUL2 may be disposed under or below the first lower plate RHL1 and the second lower plate RHL2, respectively. The first cushion layer CUL1 and the second cushion layer CUL2 may absorb an external impact to protect the display panel DP. The first cushion layer CUL1 and the second cushion layer CUL2 may include a foam sheet having an elasticity. Each of the first cushion layer CUL1 and the second cushion layer CUL2 may include a sponge or polyurethane.

The waterproof tape WFT may be attached to the first lower plate RHL1 and the second lower plate RHL2. As an example, the waterproof tape WFT may be disposed outside the first cushion layer CUL1 and the second cushion layer CUL2. The waterproof tape WFT may be attached to a set bracket (not shown). The waterproof tape WFT may have a thickness greater than a thickness of each of the first cushion layer CUL1 and the second cushion layer CUL2. Although the electronic device ED (refer to FIG. 2A) is submerged, a risk of the driving chip DIC (refer to FIG. 2A) being submerged may be reduced by the waterproof tape WFT.

At least some or a number of components of the lower member LM may be provided with a through hole COP defined therethrough. The through hole COP may overlap or correspond to the sensing area ED-SA (refer to FIG. 1A) of the electronic device ED. At least a portion of the camera module CMM (refer to FIG. 2A) may be inserted into the through hole COP.

Figure 4:
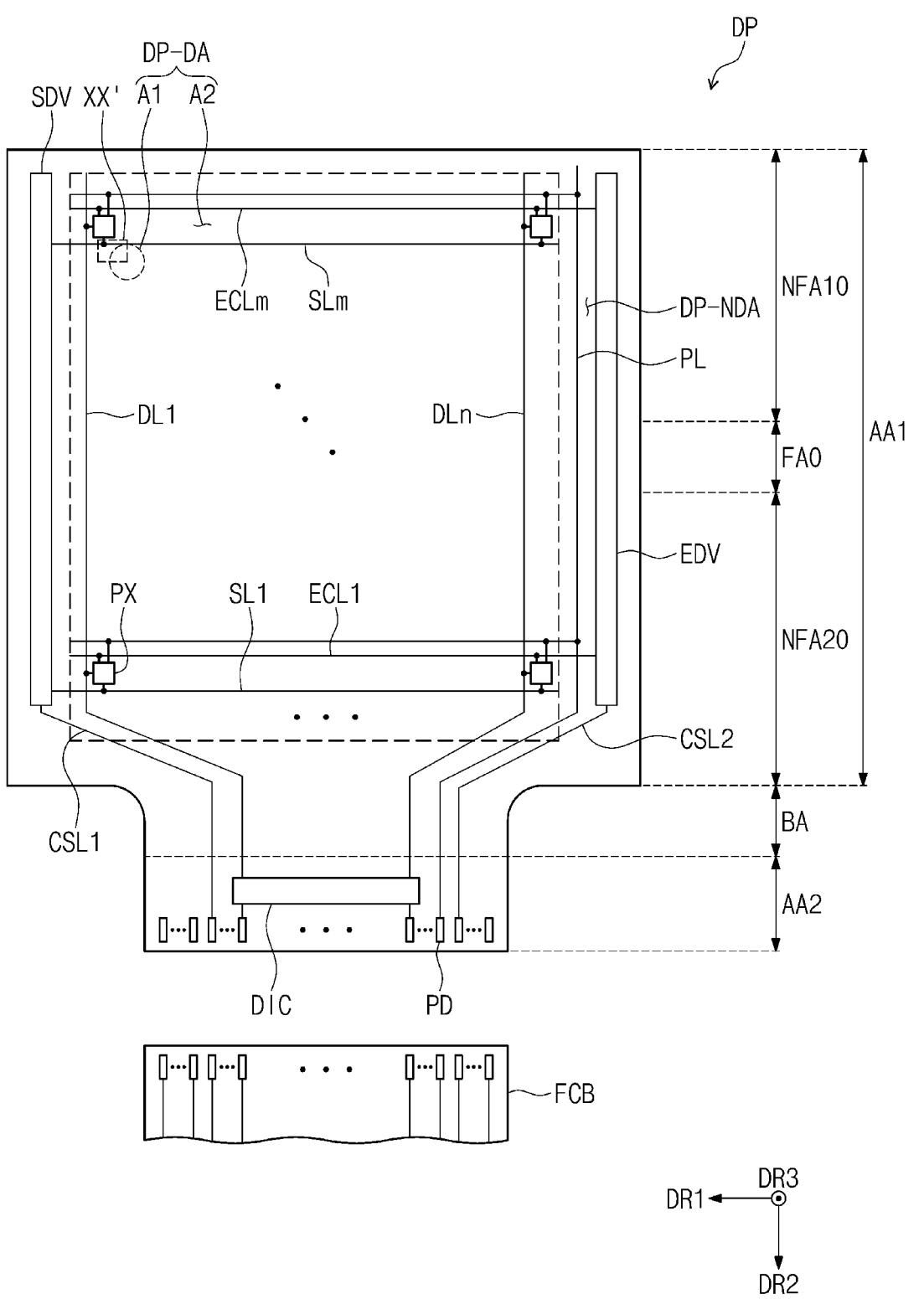
FIG. 4 is a schematic plan view showing a display panel according to an embodiment.

FIG. 4 is a schematic plan view showing the display panel DP according to an embodiment.

Referring to FIG. 4, the display panel DP may include the display area DP-DA and the non-display area DP-NDA around the display area DP-DA. The display area DP-DA and the non-display area DP-NDA may be distinguished from each other by a presence or absence of a pixel PX. The pixel PX may be disposed in the display area DP-DA. A scan driver SDV, a data driver, and an emission driver EDV may be disposed in the non-display area NDA. The data driver may be a circuit provided in the driving chip DIC.

The display area DP-DA may include the first area A1 and the second area A2. The first area A1 and the second area A2 may be distinguished from each other by an arrangement interval of the pixels PX, a size of the pixels PX, or a presence or absence of a transmission area TP (refer to FIG. 5). The first area A1 and the second area A2 will be described in detail later.

The display panel DP may include a first panel area AA1, a bending area BA, and a second panel area AA2, which are defined in the second direction DR2. The second panel area AA2 and the bending area BA may be areas of the non-display area DP-NDA. The bending area BA may be defined between the first panel area AA1 and the second panel area AA2.

The first panel area AA1 may correspond to the display surface DS of FIG. 1A. The first panel area AA1 may include a first non-folding area NFA10, a second non-folding area NFA20, and a folding area FA0. The first non-folding area NFA10, the second non-folding area NFA20, and the folding area FA0 may respectively correspond to the first non-folding area NFA1, the second non-folding area NFA2, and the folding area FA of FIGS. 1A and 1B.

A width (or a length) in the first direction DR1 of the bending area BA and a width (or a length) in the first direction DR1 of the second panel area AA2 may be smaller than a width (or a length) in the first direction DR1 of the first panel area AA1. An area having a relatively short length in a bending axis direction may be relatively readily bent.

The display panel DP may include pixels PX, scan lines SL1 to SLm, data lines DL1 to DLn, emission control lines ECL1 to ECLm, first and second control lines CSL1 and CSL2, a driving voltage line PL, and pads PD. In an embodiment, each of "m" and "n" is a natural number larger than 0. The pixels PX may be connected to the scan lines SL1 to SLm, the data lines DL1 to DLn, and the emission control lines ECL1 to ECLm.

The scan lines SL1 to SLm may extend in the first direction DR1 and may be electrically connected to the scan driver SDV. The data lines DL1 to DLn may extend in the second direction DR2 and may be electrically connected to the driving chip DIC via the bending area BA. The emission control lines ECL1 to ECLm may extend in the first direction DR1 and may be electrically connected to the emission driver EDV.

The driving voltage line PL may include a portion extending in the first direction DR1 and a portion extending in the second direction DR2. The portion extending in the first direction DR1 and the portion extending in the second direction DR2 may be disposed on different layers from each other. The portion of the driving voltage line PL, which extends in the second direction DR2, may extend to the second panel area AA2 via the bending area BA. The driving voltage line PL may provide a first voltage to the pixels PX.

The first control line CSL1 may be connected to the scan driver SDV and may extend to a lower end of the second panel area AA2 via the bending area BA. The second control line CSL2 may be connected to the emission driver EDV and may extend to the lower end of the second panel area AA2 via the bending area BA.

When viewed in a plan view, the pads PD may be disposed adjacent to the lower end of the second panel area AA2. The driving chip DIC, the driving voltage line PL, the first control line CSL1, and the second control line CSL2 may be connected to the pads PD. The flexible circuit film FCB may be electrically connected to the pads PD through an anisotropic conductive adhesive layer.

Figure 5:
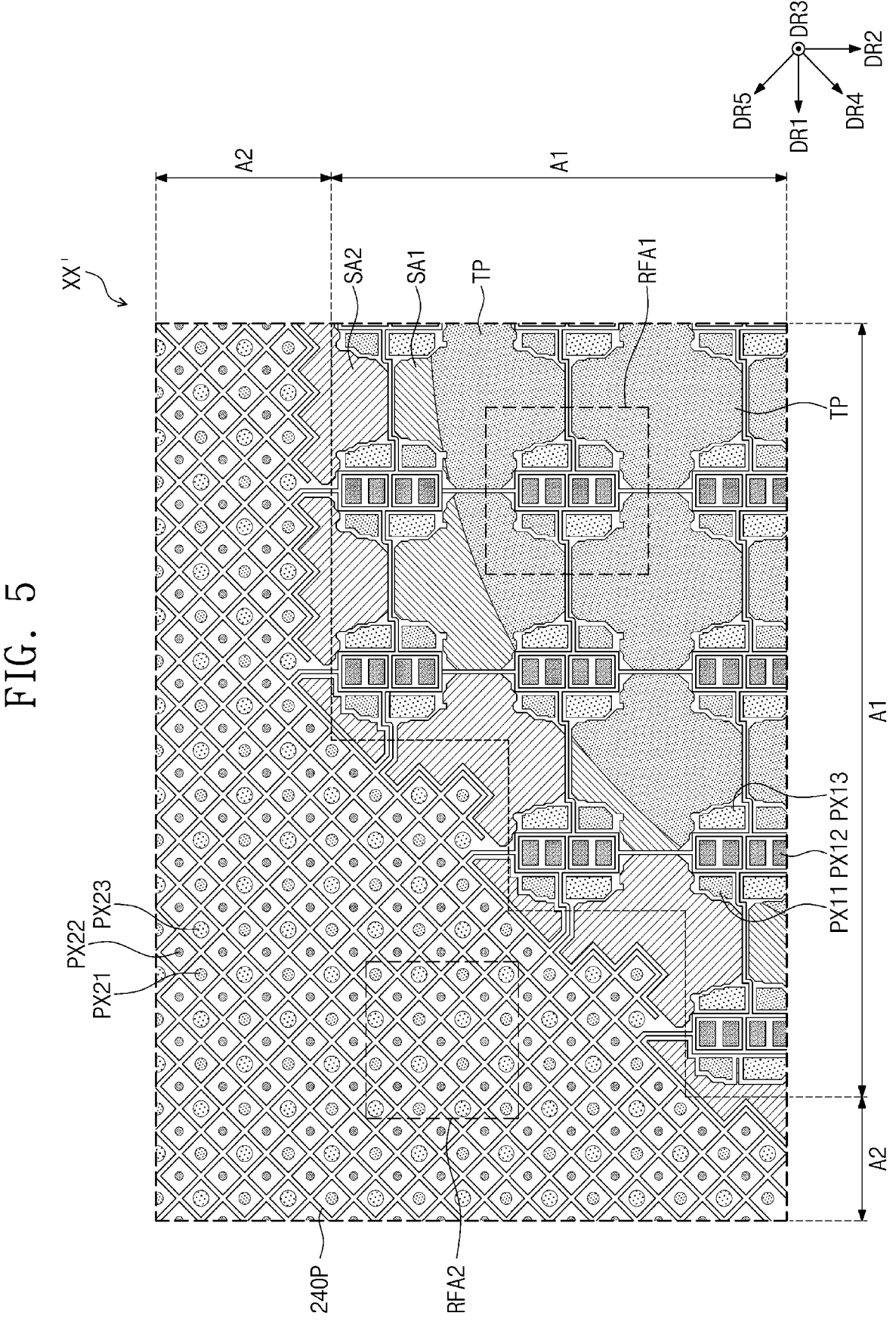
FIG. 5 is an enlarged schematic plan view showing an area XX' shown in FIG. 4.

FIG. 5 is an enlarged schematic plan view showing an area XX' shown in FIG. 4.

Referring to FIGS. 4 and 5, the pixel PX may be provided or disposed in plural, and the pixels PX may include first pixels PX11, PX12, and PX13 disposed in the first area A1 and second pixels PX21, PX22, and PX23 disposed in the second area A2. Each of the first pixels PX11, PX12, and PX13 and each of the second pixels PX21, PX22, and PX23 shown in FIG. 5 may have a shape corresponding to a light emitting area of one light emitting element LD (refer to FIG. 6) when viewed in a plan view.

The number of the first pixels PX11, PX12, and PX13 disposed in an area RFA1 (hereinafter, referred to as a first number) may be smaller than the number of the second pixels PX21, PX22, and PX23 disposed in an area RFA2 (hereinafter, referred to as a second number). Accordingly, the first area A1 may have a resolution lower than that of the second area A2. The area RFA1 defined in the first area A1 and the area RFA2 defined in the second area A2 may have substantially the same shape and the same size. As an example, the first number may be eight (8), and the second number may be twenty five (25), however, this is merely one example to explain a difference in resolution, and the first number and the second number should not be limited thereto or thereby.

The first pixels PX11, PX12, and PX13 may include a first red pixel PX11, a first green pixel PX12, and a first blue pixel PX13. The second pixels PX21, PX22, and PX23 may include a second red pixel PX21, a second green pixel PX22, and a second blue pixel PX23.

In the first area A1, two first red pixels PX11, four first green pixels PX12, and two first blue pixels PX13 may be disposed adjacent to each other. As an example, the four first green pixels PX12 may be arranged or disposed in the second direction DR2, and one first red pixel PX11 and one first blue pixel PX13 may be spaced apart from each other with two first green pixels PX12 interposed therebetween in the first direction DR1. One first red pixel PX11 may be spaced apart from one first blue pixel PX13 in the second direction DR2.

The display panel DP may include transmission areas TP defined in the first area A1. The transmission areas TP may be spaced apart from each other in the first area A1. The two first red pixels PX11, the four first green pixels PX12, and the two first blue pixels PX13 may be defined as one group, and the one group may be disposed adjacent to at least one transmission area TP. As the transmission areas TP are defined in the first area A1, the first area A1 may have a transmittance higher than a transmittance of the second area A2.

A first sub-area SA1 and a second sub-area SA2 may be further defined in the first area A1. The transmission area TP may have a transmittance higher than a transmittance of each of the first sub-area SA1 and the second sub-area SA2. For instance, the transmission area TP, the first sub-area SA1, and the second sub-area SA2 may be defined by a light blocking layer BML (refer to FIG. 7), and the transmission area TP and the first and second sub-areas SA1 and SA2 may be distinguished from each other by whether or not the transmission area TP and the first and second sub-areas SA1 and SA2 are covered or overlapped by a division layer 310 (refer to FIG. 7) or a pixel definition layer PDL (refer to FIG. 7). According to an embodiment, the second sub-area SA2 may be omitted.

Figure 7:
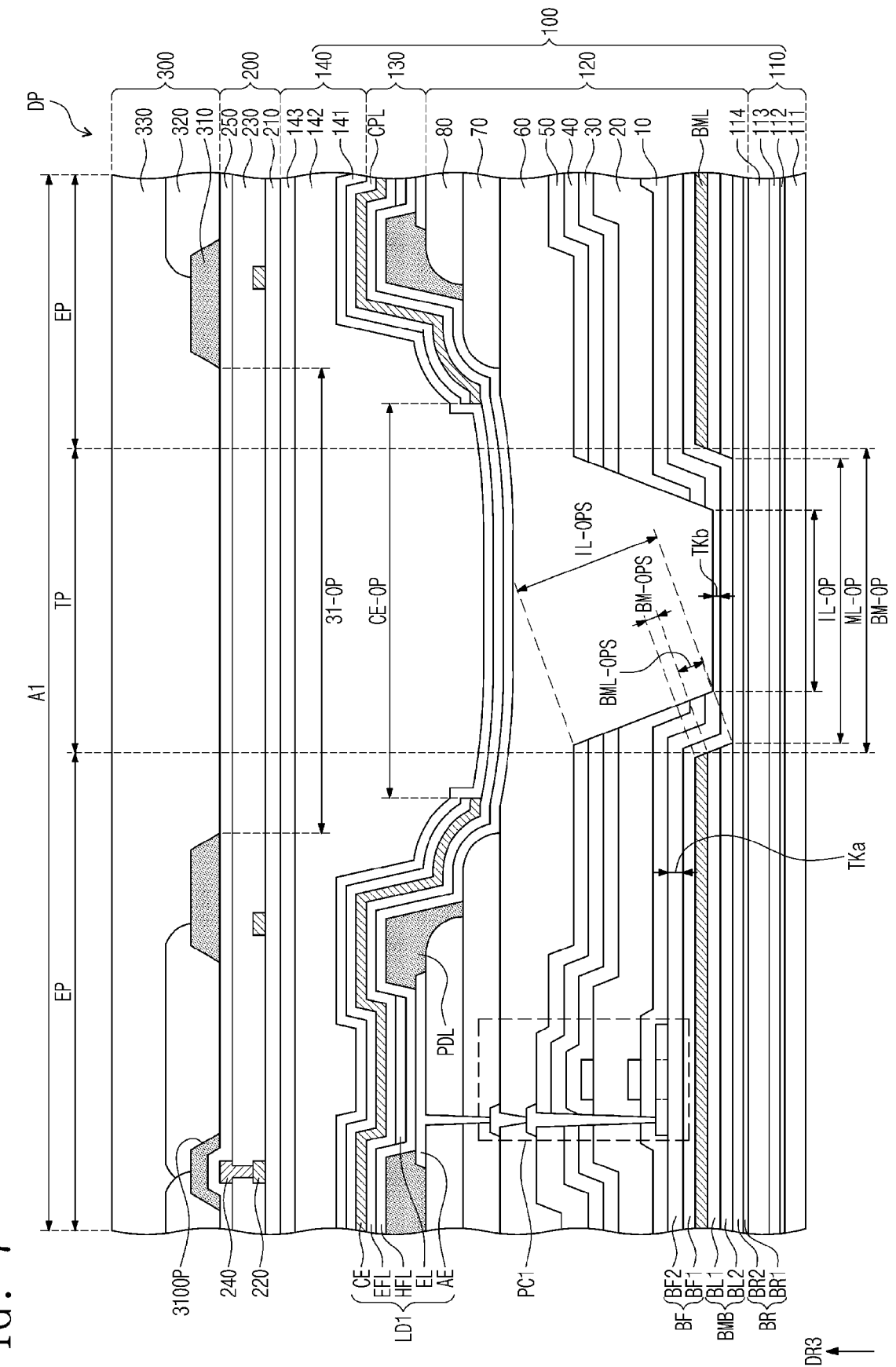
FIG. 7 is a schematic cross-sectional view showing a first area of a display panel according to an embodiment.

As an example, the first sub-area SA1 may be adjacent to the transmission area TP and may be covered or overlapped by the division layer 310 (refer to FIG. 7). The second sub-area SA2 may be spaced apart from the transmission area TP and covered or overlapped by the division layer 310 (refer to FIG. 7). Accordingly, the light may not pass through the first sub-area SA1 and the second sub-area SA2, or the first sub-area SA1 and the second sub-area SA2 may have a transmittance lower than that of the transmission area TP. Thus, the first sub-area SA1 and the second sub-area SA2 may be referred to as a light blocking area.

In FIG. 5, the first sub-area SA1 and the transmission area TP in contact with the first sub-area SA1 are indicated by different hatchings to distinguish the first sub-area SA1 from the transmission area TP in contact with the first sub-area SA1. The second sub-area SA2 is indicated by a different hatching to distinguish the second sub-area SA2 from the first sub-area SA1.

The second sub-area SA2 may be adjacent to the second area A2. As an example, the second sub-area SA2 may be in contact with a boundary between the first area A1 and the second area A2. The second sub-area SA2 may be defined in the first area A1 or the second area A2 between the first pixels PX11, PX12, and PX13 and the second pixels PX21, PX22, and PX23. Accordingly, the second sub-area SA2 may be adjacent to a pixel group disposed in the first area A1 and a pixel group disposed in the second area A2. The second sub-area SA2 may have a size smaller than a size of the transmission area TP.

According to an embodiment, the pixel definition layer PDL (refer to FIG. 7) may be further disposed in the second sub-area SA2. The pixel definition layer PDL (refer to FIG. 7) may not be disposed in the transmission areas TP and the first sub-area SA1. For example, the first sub-area SA1 may not overlap the pixel definition layer PDL (refer to FIG. 7) and may overlap the division layer 310 (refer to FIG. 7). The second sub-area SA2 may overlap both the pixel definition layer PDL (refer to FIG. 7) and the division layer 310 (refer to FIG. 7). The transmission area TP may not overlap the pixel definition layer PDL (refer to FIG. 7) and the division layer 310 (refer to FIG. 7).

Boundaries between the transmission area TP and the first sub-area SA1 may include a curved line. In case that the boundaries between the transmission area TP and the first sub-area SA1 are connected to each other, a circular shape may be formed. The first sub-area SA1 and the second sub-area SA2 may be disposed in the first area A1 adjacent to the second area A2. In the first area A1, an area in which the first sub-area SA1 and the second sub-area SA2 are defined may be defined as a boundary area. For example, two first red pixels PX11, four first green pixels PX12, and two first blue pixels PX13 may form one group and may be disposed in the boundary area, and the one group may be covered or overlapped by the division layer 310 (refer to FIG. 7) and may be adjacent to at least one of the first sub-area SA1 and/or the second sub-area SA2 having a relatively lower transmittance than that of the transmission areas TP.

In the second area A2, the second red pixel PX21 and the second green pixel PX22 may be alternately arranged or disposed one by one along a fourth direction DR4 and a fifth direction DR5. The second blue pixel PX23 and the second green pixel PX22 may be alternately arranged or disposed one by one along the fourth direction DR4 and the fifth direction DR5 in the second area A2. The fourth direction DR4 may be a direction between the first direction DR1 and the second direction DR2, and the fifth direction DR5 may be a direction crossing or intersecting the fourth direction DR4 or perpendicular to the fourth direction DR4. Based on a position of one second green pixel PX22, the second red pixel PX21 may be spaced apart from the one second green pixel PX22 in the fourth direction DR4, and the second blue pixel PX23 may be spaced apart from the one second green pixel PX22 in the fifth direction DR5.

In the second area A2, the second red pixel PX21 and the second blue pixel PX23 may be alternately arranged or disposed one by one along the first direction DR1 and the second direction DR2. The second green pixel PX22 may be repeatedly arranged or disposed in the first direction DR1 and the second direction DR2.

The first red pixel PX11 may have an area greater than an area of the second red pixel PX21, the first green pixel PX12 may have an area greater than an area of the second green pixel PX22, and the first blue pixel PX13 may have an area greater than an area of the second blue pixel PX23. However, this is merely one example, and the relationship between the areas of the first red, first green, and first blue pixels PX11, PX12, and PX13 and the second red, second green, and second blue pixels PX21, PX22, and PX23 should not be limited thereto or thereby.

The first red pixel PX11 may have a shape different from a shape of the second red pixel PX21, the first green pixel PX12 may have a shape different from a shape of the second green pixel PX22, and the first blue pixel PX13 may have a shape different from a shape of the second blue pixel PX23. However, this is merely one example, and the first red, first green, and first blue pixels PX11, PX12, and PX13 may have substantially the same shape as that of the second red, second green, and second blue pixels PX21, PX22, and PX23, respectively.

Figure 6:
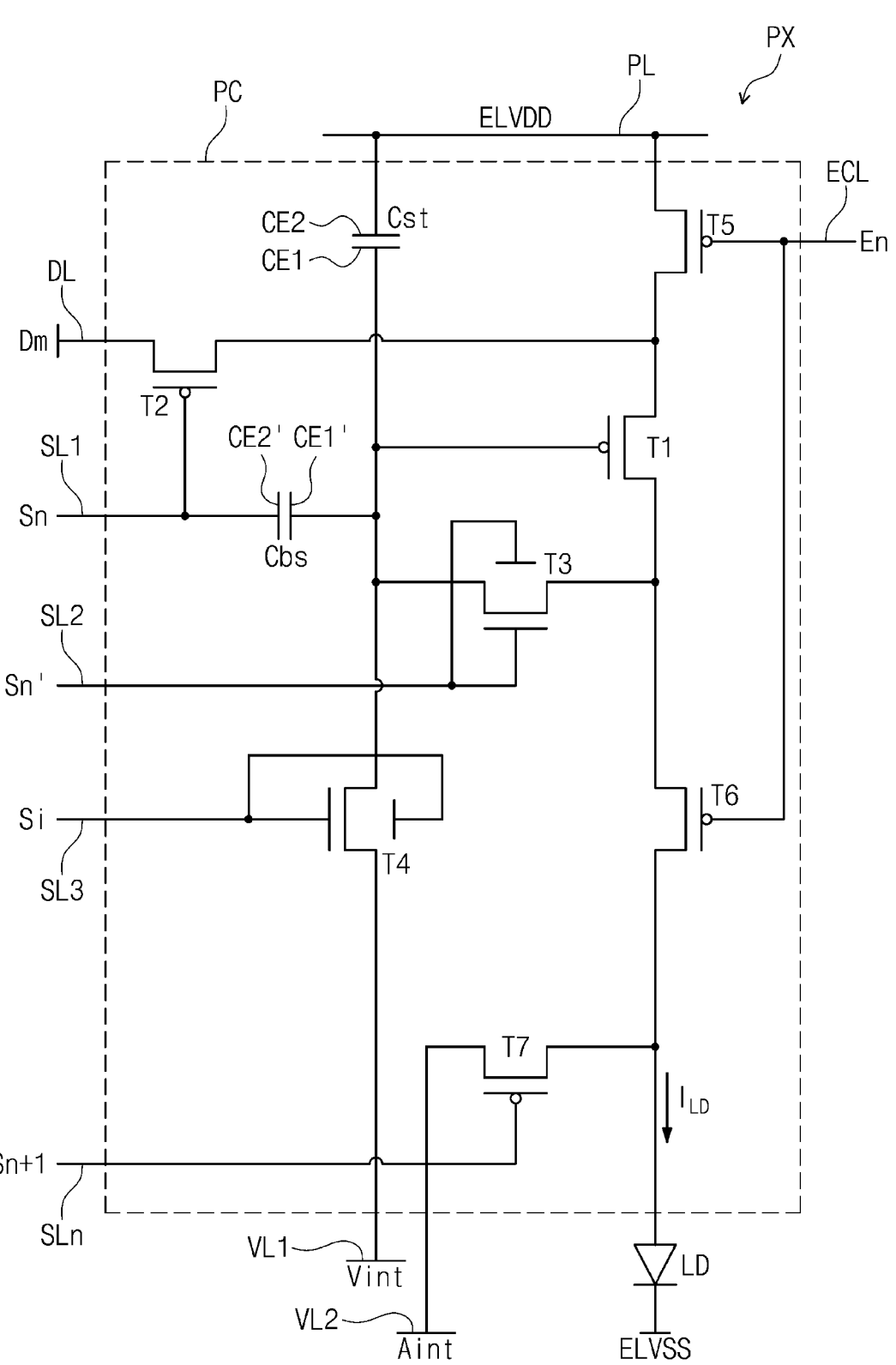
FIG. 6 is a schematic diagram of an equivalent circuit showing a pixel according to an embodiment.

FIG. 6 is a schematic diagram of an equivalent circuit showing the pixel PX according to an embodiment.

FIG. 6 shows a schematic diagram of an equivalent circuit of one pixel PX. The pixel PX shown in FIG. 6 may be the first red pixel PX11, the first green pixel PX12, the first blue pixel PX13, the second red pixel PX21, the second green pixel PX22, or the second blue pixel PX23 shown in FIG. 5.

The pixel PX may include the light emitting element LD and a pixel circuit PC. The pixel circuit PC may include thin film transistors T1 to T7, boosting capacitor Cbs and a storage capacitor Cst. The thin film transistors T1 to T7 and the storage capacitor Cst may be electrically connected to signal lines SL1, SL2, SL3, SLn, ECL, and DL, a first initialization voltage line VL1, a second initialization voltage line VL2 (or referred to as an anode initialization voltage line), and a driving voltage line PL. According to an embodiment, at least one of the lines, for example, the driving voltage line PL, may be shared by the pixels PX adjacent to each other.

The thin film transistors T1 to T7 may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The light emitting element LD may include a first electrode, for example, an anode electrode or a pixel electrode, and a second electrode, for example, a cathode electrode or a common electrode. The first electrode of the light emitting element LD may be connected to the driving thin film transistor T1 via the emission control thin film transistor T6 to receive a driving current $I_{LD}$, and the second electrode may receive a low power voltage ELVSS. The light emitting element LD may generate a light having a luminance corresponding to the driving current $I_{LD}$.

Some or a number of transistors of the thin film transistors T1 to T7 may be an n-channel MOSFET (NMOS), and the other transistors of the thin film transistors T1 to T7 may be a p-channel MOSFET (PMOS). As an example, the compensation thin film transistor T3 and the first initialization thin film transistor T4 among the thin film transistors T1 to T7 may be the n-channel MOSFET (NMOS), and the other transistors among the thin film transistors T1 to T7 may be the p-channel MOSFET (PMOS).

According to an embodiment, among the thin film transistors T1 to T7, the compensation thin film transistor T3, the first initialization thin film transistor T4, and the second initialization thin film transistor T7 may be the NMOS, and the other transistors may be the PMOS. According to an embodiment, among the thin film transistors T1 to T7, only one transistor may be the NMOS, and the other transistors may be the PMOS. According to an embodiment, all the thin film transistors T1 to T7 may be the NMOS or the PMOS.

The signal lines may include a first scan line SL1 transmitting a first scan signal Sn, a second scan line SL2 transmitting a second scan signal Sn', a third scan line SL3 transmitting a third scan signal Si to the first initialization thin film transistor T4, an emission control line ECL transmitting an emission control signal En to the operation control thin film transistor T5 and the emission control thin film transistor T6, a next scan line SLn transmitting a next scan signal Sn+1 to the second initialization thin film transistor T7, and a data line DL crossing or intersecting the first scan line SL1 and transmitting a data signal Dm. The first scan signal Sn may be a current scan signal, and the next scan signal Sn+1 may be a next scan signal of the first scan signal Sn.

The driving voltage line PL may transmit a driving voltage ELVDD to the driving thin film transistor T1, the first initialization voltage line VL1 may transmit an initialization voltage Vint to initialize the driving thin film transistor T1 and the second initialization voltage line VL2 may transmit an anode initialization voltage Aint to initialize the pixel electrode.

A driving gate electrode of the driving thin film transistor T1 may be connected to the storage capacitor Cst, a driving source area of the driving thin film transistor T1 may be connected to the driving voltage line PL via the operation control thin film transistor T5, and a driving drain area of the driving thin film transistor T1 may be electrically connected to the first electrode of the light emitting element LD via the emission control thin film transistor T6. The driving thin film transistor T1 may receive the data signal Dm in response to a switching operation of the switching thin film transistor T2 and may supply the driving current $I_{LD}$ to the light emitting element LD.

A switching gate electrode of the switching thin film transistor T2 may be connected to the first scan line SL1 transmitting the first scan signal Sn, a switching source area of the switching thin film transistor T2 may be connected to the data line DL, and a switching drain area of the switching thin film transistor T2 may be connected to the driving source area of the driving thin film transistor T1 and may be connected to the driving voltage line PL via the operation control thin film transistor T5. The switching thin film transistor T2 may be turned on in response to the first scan signal Sn provided through the first scan line SL1 and may perform the switching operation to transmit the data signal Dm applied to the data line DL to the driving source area of the driving thin film transistor T1.

A compensation gate electrode of the compensation thin film transistor T3 may be connected to the second scan line SL2. A compensation drain area of the compensation thin film transistor T3 may be connected to the driving drain area of the driving thin film transistor T1 and may be connected to the pixel electrode of the light emitting element LD via the emission control thin film transistor T6. A compensation source area of the compensation thin film transistor T3 may be connected to a first electrode CE1 of the storage capacitor Cst and the driving gate electrode of the driving thin film transistor T1. The compensation source area of the compensation thin film transistor T3 may be connected to a first initialization drain area of the first initialization thin film transistor T4.

The compensation thin film transistor T3 may be turned on in response to the second scan signal Sn' applied thereto via the second scan line SL2 and may electrically connect the driving gate electrode and the driving drain area of the driving thin film transistor T1 to allow the driving thin film transistor T1 to be connected in a diode configuration.

A first initialization gate electrode of the first initialization thin film transistor T4 may be connected to the third scan line SL3. A first initialization source area of the first initialization thin film transistor T4 may be connected to the first initialization voltage line VL1. The first initialization drain area of the first initialization thin film transistor T4 may be connected to the first electrode CE1 of the storage capacitor Cst, the compensation source area of the compensation thin film transistor T3, and the driving gate electrode of the driving thin film transistor T1. The first initialization thin film transistor T4 may be turned on in response to the third scan signal Si applied thereto through the third scan line SL3 and may transmit the initialization voltage Vint to the driving gate electrode of the driving thin film transistor T1 to perform an initialization operation that initializes a voltage of the driving gate electrode of the driving thin film transistor T1.

An operation control gate electrode of the operation control thin film transistor T5 may be connected to the emission control line ECL, an operation control source area of the operation control thin film transistor T5 may be connected to the driving voltage line PL, and an operation control drain area of the operation control thin film transistor T5 may be connected to the driving source area of the driving thin film transistor T1 and the switching drain area of the switching thin film transistor T2.

An emission control gate electrode of the emission control thin film transistor T6 may be connected to the emission control line ECL, an emission control source area of the emission control thin film transistor T6 may be connected to the driving drain area of the driving thin film transistor T1 and the compensation drain area of the compensation thin film transistor T3, and an emission control drain area of the emission control thin film transistor T6 may be connected to a second initialization drain area of the second initialization thin film transistor T7 and the pixel electrode of the light emitting element LD.

The operation control thin film transistor T5 and the emission control thin film transistor T6 may be substantially simultaneously turned on in response to the emission control signal En applied thereto via the emission control line ECL, and the driving voltage ELVDD may be applied to the light emitting element LD to allow the driving current $I_{LD}$ to flow through the light emitting element LD.

A second initialization gate electrode of the second initialization thin film transistor T7 may be connected to the next scan line SLn, the second initialization drain area of the second initialization thin film transistor T7 may be connected to the emission control drain area of the emission control thin film transistor T6 and the pixel electrode of the light emitting element LD, and the second initialization source area of the second initialization thin film transistor T7 may be connected to the second initialization voltage line VL2 to receive an anode initialization voltage Aint. The second initialization thin film transistor T7 may be turned on in response to the next scan signal Sn+1 applied thereto via the next scan line SLn to initialize the pixel electrode of the light emitting element LD.

According to an embodiment, the second initialization thin film transistor T7 may be connected to the emission control line ECL and may be driven in response to the emission control signal En. Positions of the source areas and the drain areas may be changed with each other depending on the types, for example, a p-type or an n-type, of the transistor.

The storage capacitor Cst may include the first electrode CE1 and a second electrode CE2. The first electrode CE1 of the storage capacitor Cst may be connected to the driving gate electrode of the driving thin film transistor T1, and the second electrode CE2 of the storage capacitor Cst may be connected to the driving voltage line PL. The storage capacitor Cst may be charged with electric charges corresponding to a difference between the voltage of the driving gate electrode of the driving thin film transistor T1 and the driving voltage ELVDD.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may receive the first scan signal Sn. The boosting capacitor Cbs may boost the voltage of the driving gate electrode of the driving thin film transistor T1 at a time point at which the provision of the first scan signal Sn is stopped, and thus, a voltage drop of the driving gate electrode may be compensated for.

Detailed operations of each pixel PX according to an embodiment are as follows.

In case that the third scan signal Si is provided via the third scan line SL3 during an initialization period, the first initialization thin film transistor T4 may be turned on in response to the third scan signal Si, and the driving thin film transistor T1 may be initialized by the initialization voltage Vint provided from the first initialization voltage line VL1.

In case that the first scan signal Sn and the second scan signal Sn' are provided respectively via the first scan line SL1 and the second scan line SL2 during a data programming period, the switching thin film transistor T2 and the compensation thin film transistor T3 may be turned on in response to the first scan signal Sn and the second scan signal Sn' respectively. The driving thin film transistor T1 may be connected in a diode configuration by the turned-on compensation thin film transistor T3 and may be forward biased.

A threshold voltage of the driving thin film transistor T1 is referred to as a Vth. A compensation voltage Dm+Vth (Vth is a negative (−) value) obtained by subtracting a threshold voltage of the driving thin film transistor T1 from the data signal Dm provided from the data line DL may be applied to the driving gate electrode of the driving thin film transistor T1.

The driving voltage ELVDD and the compensation voltage Dm+Vth may be respectively applied to both ends of the storage capacitor Cst, and the storage capacitor Cst may be charged with electric charges corresponding to a difference in voltage between the both ends thereof.

During a light emitting period, the operation control thin film transistor T5 and the emission control thin film transistor T6 may be turned on by the emission control signal En provided from the emission control line ECL. The driving current $I_{LD}$ according to the difference between the voltage of the driving gate electrode of the driving thin film transistor T1 and the driving voltage ELVDD may be generated, and the driving current $I_{LD}$ may be supplied to the light emitting element LD via the emission control thin film transistor T6.

According to an embodiment, at least one of the thin film transistors T1 to T7 may include a semiconductor layer containing oxide, and the other of the thin film transistors T1 to T7 may include a semiconductor layer containing silicon.

In detail, the driving thin film transistor T1, which directly affects the luminance of the display device, may include the semiconductor layer containing polycrystalline silicon with high reliability, and thus, the display device with high resolution may be implemented.

Since the oxide semiconductor has a high carrier mobility and a low leakage current, the voltage drop is not large even though the driving time is long. For example, even in case that the pixels PX are driven at low frequency, a change in color of the image due to the voltage drop is not large, and thus, the pixels PX may be driven at low frequency.

As described above, since the oxide semiconductor has low leakage current, at least one of the compensation thin film transistor T3, the first initialization thin film transistor T4, and the second initialization thin film transistor T7, which are connected to the driving gate electrode of the driving thin film transistor T1, may include the oxide semiconductor. Thus, the leakage current may be prevented from flowing to the driving gate electrode of the driving thin film transistor T1, and power consumption may be reduced.

Figure 8A:
FIG. 8A is a schematic cross-sectional view showing a second area of a display panel according to an embodiment.

FIG. 7 is a schematic cross-sectional view showing the first area A1 of the display panel DP according to an embodiment. FIG. 8A is a schematic cross-sectional view showing the second area A2 of the display panel DP according to an embodiment.

Referring to FIGS. 7 and 8A, the display panel DP may include the display layer 100, the sensor layer 200, and an anti-reflective layer 300. The display layer 100 may include a substrate 110, a circuit layer 120, a light emitting element layer 130, and an encapsulation layer 140.

The substrate 110 may include layers 111, 112, 113, and 114. As an example, the substrate 110 may include a first sub-base layer 111, a first intermediate barrier layer 112, a second intermediate barrier layer 113, and a second sub-base layer 114. The first sub-base layer 111, the first intermediate barrier layer 112, the second intermediate barrier layer 113, and the second sub-base layer 114 may be sequentially stacked each other in the third direction DR3.

Each of the first sub-base layer 111 and the second sub-base layer 114 may include at least one of a polyimide-based resin, an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, the term "A-based resin" means that a functional group of "A" is included.

A barrier layer BR may be disposed on the substrate 110. The barrier layer BR may include a first sub-barrier layer BR1 disposed on the substrate 110 and a second sub-barrier layer BR2 disposed on the first sub-barrier layer BR1.

Each of the first and second intermediate barrier layers 112 and 113 and each of the first and second sub-barrier layers BR1 and BR2 may include an inorganic material. Each of the first and second intermediate barrier layers 112 and 113 and each of the first and second sub-barrier layers BR1 and BR2 may include at least one of silicon oxide, silicon nitride, silicon oxynitride, and amorphous silicon. As an example, each of the first and second sub-base layers 111 and 114 may include polyimide having a refractive index of about 1.9. The first intermediate barrier layer 112 and the first sub-barrier layer BR1 may include silicon oxynitride (SiON) having a refractive index of about 1.72. The second intermediate barrier layer 113 and the second sub-barrier layer BR2 may include silicon oxide ($SiO_x$) having a refractive index of about 1.5.

For example, the refractive index of the first intermediate barrier layer 112 may have a value between the refractive index of the first sub-base layer 111 and the refractive index of the second intermediate barrier layer 113. The refractive index of the first sub-barrier layer BR1 may have a value between the refractive index of the second sub-base layer 114 and the refractive index of the second sub-barrier layer BR2. As a difference in refractive index between layers that are in contact with each other decreases, a reflection of the light at an interface between the layers that are in contact with each other may be reduced. As a result, the transmittance of the light passing through the transmission area TP may be improved.

The first sub-base layer 111 may have a thickness greater than a thickness of the second sub-base layer 114. As an example, the thickness of the first sub-base layer 111 may be about 100000 angstroms, and the thickness of the second sub-base layer 114 may be about 56000 angstroms. However, the thickness of each of the first and second sub-base layers 111 and 114 should not be limited thereto or thereby.

The first intermediate barrier layer 112 may have a thickness smaller than a thickness of the second intermediate barrier layer 113, and the first sub-barrier layer BR1 may have a thickness smaller than a thickness of the second sub-barrier layer BR2. As an example, the thickness of the first intermediate barrier layer 112 may be about 1000 angstroms, the thickness of the second intermediate barrier layer 113 may be about 5000 angstroms, the thickness of the first sub-barrier layer BR1 may be about 1000 angstroms, and the thickness of the second sub-barrier layer BR2 may be about 4000 angstroms. However, the thickness of each of the first and second intermediate barrier layers 112 and 113 and each of the first and second sub-barrier layers BR1 and BR2 should not be limited thereto or thereby.

The light blocking layer BML may be disposed on the barrier layer BR. The light blocking layer BML may be disposed to overlap the first area A1, and the light blocking layer BML may not be disposed in the second area A2. The light blocking layer BML may be provided with a first opening BM-OP defined therethrough to define the transmission area TP. The light blocking layer BML may be a pattern that serves as a mask in case that an opening CE-OP is formed through a common electrode CE. As an example, a light irradiated to the common electrode CE from a rear side of the substrate 110 may be supplied to each of a portion of the common electrode CE and a portion of a capping layer CPL after passing through the first opening BM-OP of the light blocking layer BML. For example, the portion of each of the common electrode CE and the capping layer CPL may be removed by the light that passes through the first opening BM-OP of the light blocking layer BML. The light may be, but not limited to, a laser beam.

The light blocking layer BML may include molybdenum (Mo), an alloy including molybdenum (Mo), silver (Ag), an alloy including silver (Ag), aluminum (Al), an alloy including aluminum (Al), aluminum nitride (AlN), tungsten (W), tungsten nitride (WN), copper (Cu), titanium (Ti), p+ doped amorphous silicon, MoTaO$_x$, or the like, however, it should not be limited thereto or thereby. The light blocking layer BML may be referred to as a rear surface metal layer or a rear surface layer.

The light blocking layer BML may be connected to an electrode or a wire and may receive a constant voltage or a signal from the electrode or wire. As an example, the light blocking layer BML may receive the initialization voltage Vint (refer to FIG. 6), however, it should not be limited thereto or thereby. The light blocking layer BML may receive the anode initialization voltage Aint (refer to FIG. 6), the low power voltage ELVSS (refer to FIG. 6), or the driving voltage ELVDD (refer to FIG. 6). According to an embodiment, the light blocking layer BML may be provided or disposed in a form that is isolated from other electrodes or wire. The light blocking layer BML may prevent the electric potential caused by the polarization phenomenon of the first sub-base layer 111 or the second sub-base layer 114 from exerting influence on a first pixel circuit PC1.

In the first area A1, an area overlapping the first opening BM-OP may be defined as the transmission area TP, and the other area may be defined as an element area EP. The first pixels PX11, PX12, and PX13 (refer to FIG. 5) may be disposed in the element area EP, and each of the first pixels PX11, PX12, and PX13 (refer to FIG. 5) may be spaced apart from the transmission area TP.

At least one lower insulating layer BMB may be disposed between the light blocking layer BML and the barrier layer BR. The lower insulating layer BMB may be provided with a second opening ML-OP defined therethrough to overlap the first opening BM-OP. The first opening BM-OP and the second opening ML-OP may be substantially simultaneously formed through the same process. Accordingly, a sidewall BM-OPS of the light blocking layer BML, which defines the first opening BM-OP, may be aligned with a sidewall BML-OPS of the lower insulating layer BMB, which defines the second opening ML-OP.

The first pixel circuit PC1 may be spaced apart from the first opening BM-OP of the light blocking layer BML and the second opening ML-OP of the lower insulating layer BMB. For example, when viewed in a plan view, the first pixel circuit PC1 may not overlap each of the first opening BM-OP of the light blocking layer BML and the second opening ML-OP of the lower insulating layer BMB.

The lower insulating layer BMB may include a first lower insulating layer BL1 disposed between the barrier layer BR and the light blocking layer BML and a second lower insulating layer BL2 disposed between the first lower insulating layer BL1 and the barrier layer BR.

Each of the first and second lower insulating layers BL1 and BL2 may include an inorganic material. As an example, each of the first and second lower insulating layers BL1 and BL2 may include at least one of silicon oxide, silicon nitride, silicon oxynitride, and amorphous silicon. As an example, the first lower insulating layer BL1 may include silicon oxide having a refractive index of about 1.5, and the second lower insulating layer BL2 may include amorphous silicon having a refractive index of about 1.7.

The refractive index of the first lower insulating layer BL1 and the refractive index of the second lower insulating layer BL2 may be different from each other. As an example, the refractive index of the first lower insulating layer BL1 may be smaller than the refractive index of the second lower insulating layer BL2, however, it should not be limited thereto or thereby. As an example, the refractive index of the first lower insulating layer BL1 may be greater than the refractive index of the second lower insulating layer BL2.

As the first and second lower insulating layers BL1 and BL2 are sequentially disposed under or below the light blocking layer BML, the reflection of the light by the light blocking layer BML may be reduced. As an example, a light incident to a rear surface of the light blocking layer BML or a light reflected by the rear surface of the light blocking layer BML may destructively interfered by light reflected between the first and second lower insulating layers BL1 and BL2. As a result, a probability that a noise image, for example, a ghost phenomenon, occurs in an image acquired by the camera module CMM (refer to FIG. 2A) may be reduced or eliminated. Accordingly, the quality of signals acquired by or received from the camera module CMM (refer to FIG. 2A) may be improved. The first and second lower insulating layers BL1 and BL2 may be referred to as first and second anti-reflective layers, respectively.

FIG. 7 shows a structure in which two lower insulating layers, for example, the first and second lower insulating layers BL1 and BL2, are disposed under or below the light blocking layer BML as a representative example, however, it should not be limited thereto or thereby. As an example, the lower insulating layer disposed under or below the light blocking layer BML may include one layer, or three or more layers.

A thickness of the first lower insulating layer BL1 may be substantially the same as a thickness of the second lower insulating layer BL2. As an example, each of the thickness of the first lower insulating layer BL1 and the thickness of the second lower insulating layer BL2 may be about 130 angstroms, however, it should not be limited thereto or thereby. The thickness of the first lower insulating layer BL1 and the thickness of the second lower insulating layer BL2 may be different from each other.

A buffer layer BF may be disposed in both the first area A1 and the second area A2. The buffer layer BF may be disposed on the barrier layer BR and may cover or overlap the light blocking layer BML and the lower insulating layer BMB, which are disposed in the first area A1. The buffer layer BF may prevent metal atoms or impurities from being diffused to a first semiconductor pattern from the substrate 110. The buffer layer BF may control a rate of heat supply during a crystallization process to form the first semiconductor pattern so that the first semiconductor pattern may be uniformly formed.

The buffer layer BF may cover or overlap the first opening BM-OP and the second opening ML-OP, and the buffer layer BF may overlap the transmission area TP. The buffer layer BF may include a first sub-buffer layer BF1 and a second sub-buffer layer BF2 disposed on the first sub-buffer layer BF1. Each of the first sub-buffer layer BF1 and the second sub-buffer layer BF2 may include at least one of silicon oxide, silicon nitride, and silicon oxynitride. As an example, the first sub-buffer layer BF1 may include silicon nitride, and the second sub-buffer layer BF2 may include silicon oxide.

A portion of the second sub-buffer layer BF2, which overlaps the transmission area TP, may be removed. Accordingly, a thickness TKa of a portion of the second sub-buffer layer BF2 disposed in the element area EP may be greater than a thickness TKb of the portion of the second sub-buffer layer BF2 disposed in the transmission area TP. As an example, the thickness TKb of the portion of the second sub-buffer layer BF2 disposed in the transmission area TP may be about 500 angstroms, however, it should not be particularly limited.

Each of the first pixels PX11, PX12, and PX13 (refer to FIG. 5) may include a first light emitting element LD1 and the first pixel circuit PC1, and each of the second pixels PX21, PX22, and PX23 may include a second light emitting element LD2 and a second pixel circuit PC2. The first light emitting element LD1 may be disposed in the element area EP, and the second light emitting element LD2 may be disposed in the second area A2.

FIG. 7 shows a cross-section of a portion of the first light emitting element LD1 and the first pixel circuit PC1, which are disposed in the first area A1, and FIG. 8A shows a cross-section of a portion of the second light emitting element LD2 and the second pixel circuit PC2, which are disposed in the second area A2. FIG. 8A shows a silicon thin film transistor S-TFT and an oxide thin film transistor O-TFT of the second pixel circuit PC2.

Referring to FIG. 8A, a first light blocking layer BMLa may be disposed under or below the silicon thin film transistor S-TFT, and a second light blocking layer BMLb may be disposed under or below the oxide thin film transistor O-TFT. Each of the first light blocking layer BMLa and the second light blocking layer BMLb may be disposed to overlap the second pixel circuit PC2 to protect the second pixel circuit PC2. The first light blocking layer BMLa and the second light blocking layer BMLb may not be disposed in the first area A1.

The first and second light blocking layers BMLa and BMLb may prevent the electric potential caused by the polarization phenomenon of the first sub-base layer 111 or the second sub-base layer 114 from exerting influence on the second pixel circuit PC2. According to an embodiment, the second light blocking layer BMLb may be omitted.

The first light blocking layer BMLa may be disposed in the second sub-barrier layer BR2. As an example, a portion in a thickness direction of the second sub-barrier layer BR2 is formed, and the first light blocking layer BMLa is formed thereon. The other portion in the thickness direction of the second sub-barrier layer BR2 may be formed to cover or overlap the first light blocking layer BMLa. The first light blocking layer BMLa may be referred to as a rear surface light blocking layer.

The second light blocking layer BMLb may be disposed between a second insulating layer 20 and a third insulating layer 30. The second light blocking layer BMLb may be disposed on a same layer as a layer on which the second electrode CE2 of the storage capacitor Cst is disposed. The second light blocking layer BMLb may be connected to a contact electrode BML2-C to receive a constant voltage or a signal. The contact electrode BML2-C may be disposed on a same layer as a layer on which a gate GT2 of the oxide thin film transistor O-TFT is disposed. Each of the first and second light blocking layers BMLa and BMLb may include a same material or a similar material as or different materials from that of the light blocking layer BML.

Each of the first light blocking layer BMLa and the second light blocking layer BMLb may be connected to an electrode or a wire to receive the constant voltage or the signal. The voltage and the signal, which are applied to each of the first light blocking layer BMLa and the second light blocking layer BMLb, may be different from the voltage and the signal, which are applied to the light blocking layer BML. As an example, each of the first light blocking layer BMLa and the second light blocking layer BMLb may receive the driving voltage ELVDD (refer to FIG. 6). According to an embodiment, the voltage and the signal, which are applied to each of the first light blocking layer BMLa and the second light blocking layer BMLb, may be substantially the same as the voltage and the signal, which are applied to the light blocking layer BML. According to an embodiment, each of the first light blocking layer BMLa and the second light blocking layer BMLb may be provided or disposed in a form isolated from another electrode or another wire.

The first semiconductor pattern may be disposed on the buffer layer BF. The first semiconductor pattern may include a silicon semiconductor. As an example, the silicon semiconductor may include amorphous silicon or polycrystalline silicon. For example, the first semiconductor pattern may include low temperature polycrystalline silicon.

FIGS. 7 and 8A show only a portion of the first semiconductor pattern disposed on the buffer layer BF, and the first semiconductor pattern may be further disposed in other areas. The first semiconductor pattern may be arranged or disposed with a specific or given rule over the pixels. The first semiconductor pattern may have different electrical properties depending on whether it is doped or not or whether it is doped with an N-type dopant or a P-type dopant. The first semiconductor pattern may include a first region having a relatively high conductivity and a second region having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or signal line. The second region may substantially correspond to an active area (or a channel) of the transistor. In other words, a portion of the first semiconductor pattern may be the active area of the transistor, another portion of the first semiconductor pattern may be a source or a drain of the transistor, and the other portion of the first semiconductor pattern may be a connection electrode or a connection signal line.

A source area SE1, an active area AC1, and a drain area DE1 of the silicon thin film transistor S-TFT may be formed from the first semiconductor pattern. The source area SE1 and the drain area DE1 may extend in opposite directions to each other from the active area AC1 in a cross-section.

A first insulating layer 10 may be disposed on the buffer layer BF. The first insulating layer 10 may commonly overlap the pixels and may cover or overlap the first semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. In an embodiment, the first insulating layer 10 may have a single-layer structure of a silicon oxide layer. Not only the first insulating layer 10, but also other insulating layers of the circuit layer 120 described later may be an inorganic layer and/or an organic layer and may have a single-layer or multi-layer structure. The inorganic layer may include at least one of the above-mentioned materials, however, it should not be limited thereto or thereby.

A gate GT1 of the silicon thin film transistor S-TFT may be disposed on the first insulating layer 10. The gate GT1 may be a portion of a metal pattern. The gate GT1 may overlap the active area AC1. The gate GT1 may be used as a mask in a process of doping the first semiconductor pattern. The gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), or the like, however, it should not be particularly limited.

The second insulating layer 20 may be disposed on the first insulating layer 10 and may cover or overlap the gate GT1. The second insulating layer 20 may be an inorganic layer and may have a single-layer or multi-layer structure. The second insulating layer 20 may include at least one of silicon oxide, silicon nitride, and silicon oxynitride. According to an embodiment, the second insulating layer 20 may have the multi-layer structure of a silicon oxide layer and a silicon nitride layer.

The third insulating layer 30 may be disposed on the second insulating layer 20. The third insulating layer 30 may have a single-layer or multi-layer structure. As an example, the third insulating layer 30 may have the multi-layer structure of a silicon oxide layer and a silicon nitride layer. The second electrode CE2 of the storage capacitor Cst may be disposed between the second insulating layer 20 and the third insulating layer 30. The first electrode CE1 of the storage capacitor Cst may be disposed between the first insulating layer 10 and the second insulating layer 20.

A second semiconductor pattern may be disposed on the third insulating layer 30. The second semiconductor pattern may include an oxide semiconductor. The oxide semiconductor may include areas distinguished from each other depending on whether a metal oxide is reduced. The area (hereinafter, referred to as a reduced area) in which the metal oxide is reduced has a conductivity greater than that of the area (hereinafter, referred to as a non-reduced area) in which the metal oxide is not reduced. The reduced area may act as the source or drain of the transistor or the signal line. The non-reduced area may substantially correspond to the active area (or a semiconductor area, or a channel) of the transistor. In other words, a portion of the second semiconductor pattern may be the active area of the transistor, another portion of the second semiconductor pattern may be the source or drain areas of the transistor, and the other portion of the second semiconductor pattern may be a signal transmission area.

A source area SE2, an active area AC2, and a drain area DE2 of the oxide thin film transistor O-TFT may be formed from the second semiconductor pattern. The source area SE2 and the drain area DE2 may extend in opposite directions to each other from the active area AC2 in a cross-section.

A fourth insulating layer 40 may be disposed on the third insulating layer 30. The fourth insulating layer 40 may commonly overlap the pixels and may cover or overlap the second semiconductor pattern. The fourth insulating layer 40 may include at least one of aluminum oxide, titanium oxide, silicon oxide, silicon nitride, silicon oxynitride, zirconium oxide, and hafnium oxide.

The gate GT2 of the oxide thin film transistor O-TFT may be disposed on the fourth insulating layer 40. The gate GT2 of the oxide thin film transistor O-TFT may be a portion of a metal pattern. The gate GT2 of the oxide thin film transistor O-TFT may overlap the active area AC2. The gate GT2 may be used as a mask in a process of doping the second semiconductor pattern.

A fifth insulating layer 50 may be disposed on the fourth insulating layer 40 and may cover or overlap the gate GT2.

The fifth insulating layer 50 may be an inorganic layer and/or an organic layer and may have a single-layer or multi-layer structure.

A first connection electrode CNE1 may be disposed on the fifth insulating layer 50. The first connection electrode CNE1 may be connected to the drain area DE1 of the silicon thin film transistor S-TFT via a contact hole defined through the first to fifth insulating layers 10 to 50.

Referring to FIG. 7, the buffer layer BF and at least some or a number of insulating layers of the insulating layers 10, 20, 30, 40, 50, 60, 70, and 80, which are included in the circuit layer 120, may be provided with a third opening IL-OP defined therethrough. As an example, the third opening IL-OP may be defined through a portion in the thickness direction of the second sub-buffer layer BF2 and the first, second, third, fourth, and fifth insulating layers 10, 20, 30, 40, and 50. The third opening IL-OP may be defined in an area overlapping the transmission area TP. For example, as a portion in the thickness direction of the second sub-buffer layer BF2 and the first, second, third, fourth, and fifth insulating layers 10, 20, 30, 40, and 50, which overlap the transmission area TP, are removed, the transmittance of the transmission area TP may be improved.

A minimum width of the third opening IL-OP may be smaller than a minimum width of the first opening BM-OP. A sidewall IL-OPS of the second sub-buffer layer BF2 and the first, second, third, fourth, and fifth insulating layers 10, 20, 30, 40, and 50, which define the third opening IL-OP, may more protrude than the sidewall BM-OPS of the light blocking layer BML. For example, the sidewall IL-OPS of the second sub-buffer layer BF2 and the first, second, third, fourth, and fifth insulating layers 10, 20, 30, 40, and 50 may protrude closer to a center of the transmission area TP than the sidewall BM-OPS of the light blocking layer BML.

A sixth insulating layer 60 may be disposed on the fifth insulating layer 50. The sixth insulating layer 60 may include an organic material. For example, the sixth insulating layer 60 may include a polyimide-based resin. A second connection electrode CNE2 may be disposed on the sixth insulating layer 60. The second connection electrode CNE2 may be connected to the first connection electrode CNE1 through a contact hole defined through the sixth insulating layer 60.

The sixth insulating layer 60 may cover or overlap the third opening IL-OP. For example, the sixth insulating layer 60 may overlap the transmission area TP. As the sixth insulating layer 60 is provided or disposed in the transmission area TP, a step difference between components disposed above the sixth insulating layer 60 may be reduced. In case that the step difference between layers overlapping the transmission area TP is reduced, a diffraction of the light incident into the transmission area TP may be alleviated (or reduced). Accordingly, a deformation of the image, which is caused by the diffraction, may be reduced, and the quality of the image acquired by the camera module CMM (refer to FIG. 2A) may be improved.

The transmittance of the transmission area TP may be controlled by adjusting the thickness of the sixth insulating layer 60. The thickness of the sixth insulating layer 60 may be about 15000 angstroms, which makes it easier to control the thickness thereof compared with the insulating layer having a thickness of about several to hundreds of angstroms. Accordingly, a transmittance distribution for each electronic device may be reduced, and thus, a process management may be facilitated.

The sixth insulating layer 60 may cover or overlap the third opening IL-OP. Accordingly, a step difference between a portion of the sixth insulating layer 60 where the seventh insulating layer 70, the eighth insulating layer 80, and the pixel defining layer PDL are to be provided and a portion of the sixth insulating layer 60 overlapping the transmission area TP may be reduced. The seventh insulating layer 70, an eighth insulating layer 80, and the pixel definition layer PDL, which are disposed on the sixth insulating layer 60, may be prevented from flowing down to the transmission area TP during the manufacturing process.

The seventh insulating layer 70 may be disposed on the sixth insulating layer 60 and may cover or overlap the second connection electrode CNE2. The eighth insulating layer 80 may be disposed on the seventh insulating layer 70.

Each of the sixth insulating layer 60, the seventh insulating layer 70, and the eighth insulating layer 80 may be an organic layer. As an example, each of the sixth insulating layer 60, the seventh insulating layer 70, and the eighth insulating layer 80 may include a general-purpose polymer, such as benzocyclobutene (BCB), polyimide, hexamethyl-disiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The light emitting element layer 130 including the first and second light emitting elements LD1 and LD2 may be disposed on the circuit layer 120. Each of the first and second light emitting elements LD1 and LD2 may include a pixel electrode AE, a first functional layer HFL, a light emitting layer EL, a second functional layer EFL, and a common electrode CE. The first functional layer HFL, the second functional layer EFL, and the common electrode CE may be connected to the pixels PX (refer to FIG. 4) and may be commonly provided.

The pixel electrode AE may be disposed on the eighth insulating layer 80. The pixel electrode AE may be a semi-transmissive electrode, a transmissive electrode, or a reflective electrode. According to an embodiment, the pixel electrode AE may include a reflective layer formed of Ag, Mg, Al, Pt, Pd, Au, Ni, Nd, Ir, Cr, or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide ($In_2O_3$), and aluminum-doped zinc oxide (AZO). For instance, the pixel electrode AE may have a stack structure of ITO/Ag/ITO.

The pixel definition layer PDL may be disposed on the eighth insulating layer 80. The pixel definition layer PDL may have a light absorbing property, for example, the pixel definition layer PDL may have a black color. The pixel definition layer PDL may include a black coloring agent. The black coloring agent may include a black dye or a black pigment. The black coloring agent may include carbon black, a metal material, such as chromium, or an oxide thereof.

The pixel definition layer PDL may be provided with an opening PDL-OP defined therethrough to expose a portion of the pixel electrode AE. For example, the pixel definition layer PDL may cover or overlap an edge of the pixel electrode AE. The pixel definition layer PDL may cover or overlap a side surface of the eighth insulating layer 80 adjacent to the transmission area TP.

The first functional layer HFL may be disposed on the pixel electrode AE and the pixel definition layer PDL. The first functional layer HFL may include a hole transport layer, may include a hole injection layer, or may include both the hole transport layer and the hole injection layer. The first functional layer HFL may be disposed over the first area A1 and the second area A2, and the first functional layer HFL may be disposed in the transmission area TP.

The light emitting layer EL may be disposed on the first functional layer HFL and may be disposed in an area corresponding to the opening PDL-OP of the pixel definition layer PDL. The light emitting layer EL may include an organic material, an inorganic material, or an organic-inorganic material which emits a light having a color. The light emitting layer EL may be disposed in the first area A1 and the second area A2. The light emitting layer EL disposed in the first area A1 may be disposed in an area spaced apart from the transmission area TP, for example, the element area EP.

The second functional layer EFL may be disposed on the first functional layer HFL and may cover or overlap the light emitting layer EL. The second functional layer EFL may include an electron transport layer, may include an electron injection layer, or may include both the electron transport layer and the electron injection layer. The second functional layer EFL may be disposed over the first area A1 and the second area A2, and the second functional layer EFL may also be disposed in the transmission area TP.

The common electrode CE may be disposed on the second functional layer EFL. The common electrode CE may be disposed in the first area A1 and the second area A2. The common electrode CE may be provided with an opening CE-OP defined therethrough to overlap the first opening BM-OP. A minimum width of the opening CE-OP may be greater than a minimum width of the first opening BM-OP of the light blocking layer BML.

The light emitting element layer 130 may further include the capping layer CPL disposed on the common electrode CE. The capping layer CPL may include LiF, an inorganic material, and/or an organic material. A portion of the capping layer CPL, which overlaps the opening CE-OP of the common electrode CE, may be removed. As the portion of the capping layer CPL and the portion of the common electrode CE, which overlap the transmission area TP, are removed, the transmittance of the transmission area TP may be improved.

The encapsulation layer 140 may be disposed on the light emitting element layer 130. The encapsulation layer 140 may include an inorganic layer 141, an organic layer 142, and an inorganic layer 143, which may be sequentially stacked each other, however, layers included in the encapsulation layer 140 should not be limited thereto or thereby.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, however, it should not be limited thereto or thereby.

The sensor layer 200 may be disposed on the display layer 100. The sensor layer 200 may be referred to as a sensor, an input sensing layer, or an input sensing panel. The sensor layer 200 may include a sensor base layer 210, a first sensor conductive layer 220, a sensor insulating layer 230, a second sensor conductive layer 240, and a sensor cover layer 250.

The sensor base layer 210 may be disposed on or directly disposed on the display layer 100. The sensor base layer 210 may be an inorganic layer including at least one of silicon nitride, silicon oxynitride, and silicon oxide. According to an embodiment, the sensor base layer 210 may be an organic layer including an epoxy resin, an acrylic resin, or an imide-based resin. The sensor base layer 210 may have a single-layer structure or a multi-layer structure of layers stacked in the third direction DR3.

Each of the first sensor conductive layer 220 and the second sensor conductive layer 240 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like within the spirit and the scope of the disclosure. The transparent conductive layer may include conductive polymer such as PEDOT, metal nanowire, graphene, or the like within the spirit and the scope of the disclosure.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The sensor insulating layer 230 may be disposed between the first sensor conductive layer 220 and the second sensor conductive layer 240. The sensor insulating layer 230 may include an inorganic layer. The inorganic layer may include at least one of aluminum oxide, titanium oxide, silicon oxide, silicon nitride, silicon oxynitride, zirconium oxide, and hafnium oxide.

According to an embodiment, the sensor insulating layer 230 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The sensor cover layer 250 may be disposed on the sensor insulating layer 230 and may cover or overlap the second sensor conductive layer 240. The second sensor conductive layer 240 may include a conductive pattern 240P (refer to FIG. 5). The sensor cover layer 250 may cover or overlap the conductive pattern 240P (refer to FIG. 5) and may reduce a possibility of occurrence of damages in the conductive pattern 240P (refer to FIG. 5) in the subsequent process.

The sensor cover layer 250 may include an inorganic material. As an example, the sensor cover layer 250 may include silicon nitride, however, it should not be limited thereto or thereby.

The anti-reflective layer 300 may be disposed on the sensor layer 200. The anti-reflective layer 300 may include the division layer 310, color filters 320, and a planarization layer 330. The division layer 310 and the color filters 320 may not be disposed in the transmission area TP of the first area A1.

The division layer 310 may be disposed to overlap the second sensor conductive layer 240. The sensor cover layer 250 may be disposed between the division layer 310 and the second sensor conductive layer 240. The division layer 310 may prevent an external light from being reflected by the second sensor conductive layer 240. Materials for the division layer 310 should not be particularly limited as long as the materials absorb a light. The division layer 310 may have a black color and may have a black coloring agent. The black coloring agent may include a black dye or a black pigment. The black coloring agent may include carbon black, a metal material, such as chromium, or an oxide thereof.

The division layer 310 may be provided with division openings 3100P and an opening 31-OP, which are defined therethrough. The division openings 3100P may overlap the light emitting layers EL, respectively. The color filters 320 may be disposed to correspond to the division openings 3100P, respectively. The color filter 320 may transmit a light provided from the light emitting layer EL overlapping the color filter 320. The opening 31-OP of the division layer 310 may overlap the first opening BM-OP of the light blocking layer BML. A minimum width of the opening 31-OP of the division layer 310 may be greater than a minimum width of the first opening BM-OP of the light blocking layer BML. An edge of the division layer 310 may more protrude than an edge of the pixel definition layer PDL in an area adjacent to the transmission area TP. When viewed in a plan view, the edge of the division layer 310 may be disposed between the edge of the pixel definition layer PDL and an edge of the light blocking layer BML.

The planarization layer 330 may cover or overlap the division layer 310 and the color filters 320. The planarization layer 330 may include an organic material and may provide a flat surface on an upper surface thereof. According to an embodiment, the planarization layer 330 may be omitted.

Figure 8B:
FIG. 8B is a schematic cross-sectional view showing a second area of a display panel according to an embodiment.

FIG. 8B is a schematic cross-sectional view showing the second area A2 of the display panel DP-1 according to an embodiment. In the following descriptions with reference to FIG. 8B, different features from those of FIG. 8A will be described. In FIG. 8B, the same reference numerals denote the same elements in FIG. 8A, and thus, detailed descriptions of the same elements may be omitted.

Referring to FIG. 8B, the display panel DP-1 may include the display layer 100-1, the sensor layer 200, and an anti-reflective layer 300-1. The display layer 100-1 may include a substrate 110, a circuit layer 120, a light emitting element layer 130, and an encapsulation layer 140.

The anti-reflective layer 300-1 may include a reflection control layer 320-1 on the division layer 310. The reflection control layer 320-1 may selectively absorb light of a certain band among pieces of light reflected from the inside of the display panel DP-1 and/or the electronic device or pieces of light incident from the outside of the display panel DP-1 and/or the electronic device.

For example, the reflection control layer 320-1 may absorb light of a first wavelength band of about 490 nm to about 505 nm and a second wavelength band of about 585 nm to about 600 nm, so that light transmittance of the light in the first wavelength band and the second wavelength band is about 40% or less. The reflection control layer 320-1 may absorb light of wavelengths out of the wavelength ranges of red light, green light, and blue light respectively emitted from the first display element, the second display element, and the third display element. Because the reflection control layer 320-1 absorbs light of wavelengths that do not belong to the wavelength ranges of the red light, the green light, and the blue light emitted from the display elements, the reduction in the luminance of the display panel DP-1 and/or the electronic device may be prevented or minimized. Also, the reduction in the luminescence efficiency of the display panel DP-1 and/or the electronic device may be prevented or minimized, and the visibility of the display panel DP-1 and/or the electronic device may be improved.

The reflection control layer 320-1 may include an organic material layer including a dye, a pigment, and/or any combination thereof. The reflection control layer 320-1 may include a tetraazaporphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, and/or any combination thereof.

In an embodiment, the reflection control layer 320-1 may have a transmittance of about 64% to about 72%. The transmittance of the reflection control layer 320-1 may be controlled according to the amount of the pigment and/or the dye included in the reflection control layer 320-1. The reflection control layer 320-1 overlaps the display elements in a plan view, but does not overlap the transmission area TP in a plan view. In a plan view, the transmission area TP may overlap the pixel definition layer PDL without overlapping the reflection control layer 320-1.

According to the embodiment including the reflection control layer 320-1, a low reflection layer LRL may be additionally between the capping layer CPL and the encapsulation layer 140.

Due to the principle of constructive interference, the capping layer CPL may improve the luminescence efficiency of the display element. The capping layer CPL may include, for example, a material having a refractive index of about 1.6 or greater for light having a wavelength of about 589 nm.

The capping layer CPL may be an organic capping layer including an organic material, an inorganic capping layer including an inorganic material, or a composite capping layer including an organic material and an inorganic material. For example, the capping layer CPL may include a carbocyclic compound, a heterocyclic compound, an amine group-containing compound, porphine derivatives, phthalocyanine derivatives, naphthalocyanine derivatives, an alkali metal complex, an alkaline earth metal complex, and/or any combination thereof. The carbocyclic compound, the heterocyclic compound, and the amine group-containing compound may optionally be substituted with substituents including O, N, S, Se, Si, F, Cl, Br, I, and/or any combination thereof.

The low reflection layer LRL may be on the capping layer CPL. The low reflection layer LRL may include an inorganic material having low reflectance. In an embodiment, the low reflection layer LRL may include a metal or a metal oxide. When the low reflection layer LRL includes a metal, the low reflection layer LRL may include, for example, ytterbium (Yb), bismuth (Bi), cobalt (Co), molybdenum (Mo), titanium (Ti), zirconium (Zr), aluminum (Al), chromium (Cr)), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and/or any combination thereof. Also, when the low reflection layer LRL includes a metal oxide, the low reflection layer LRL may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, and/or any combination.

In an embodiment, the inorganic material included in the low reflection layer LRL may have an absorption coefficient (k) of greater than 0.5 and less than or equal to 4.0

(0.5<k≤4.0). Also, the inorganic material included in the low reflection layer LRL may have a refractive index (n) of 1 or more (n≥1.0).

The low reflection layer LRL induces destructive interference between light incident on the display panel and/or the electronic device and light reflected from the metal below the low reflection layer LRL, so that external light reflectance may be reduced. Therefore, the display quality and visibility of the display panel and/or the electronic device may be improved.

In some embodiments, the capping layer CPL may be omitted and the low reflection layer LRL may be in contact with the common electrode CE.

Figure 9:
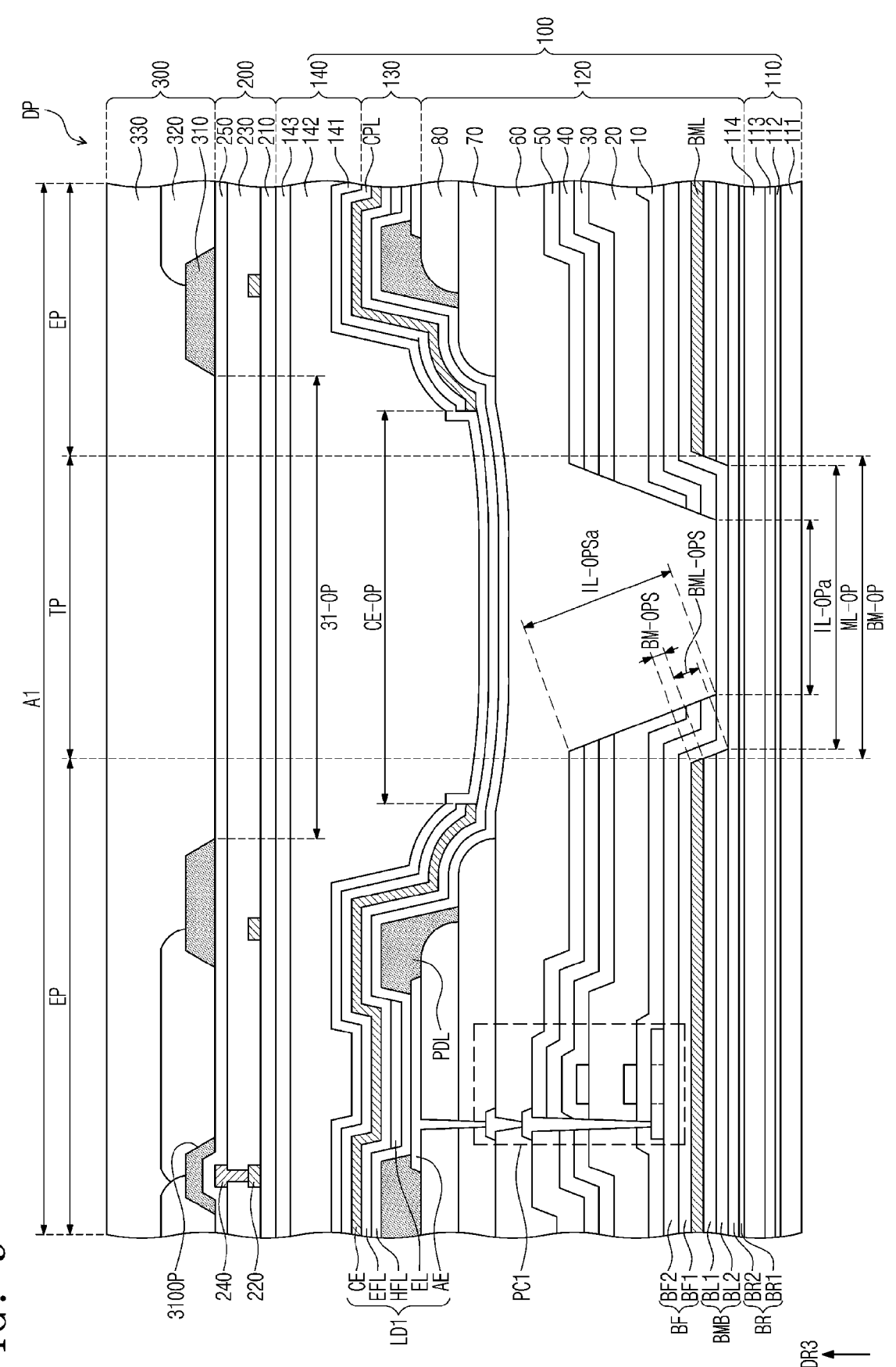
FIG. 9 is a schematic cross-sectional view showing a first area of a display panel according to an embodiment.

FIG. 9 is a schematic cross-sectional view showing a first area A1 of a display panel DP according to an embodiment. In the following descriptions with reference to FIG. 9, different features from those of FIG. 7 will be described. In FIG. 9, the same reference numerals denote the same elements in FIG. 7, and thus, detailed descriptions of the same elements may be omitted.

Referring to FIG. 9, a buffer layer BF and at least some or a number of insulating layers of insulating layers 10, 20, 30, 40, 50, 60, 70, and 80, which are included in a circuit layer 120, may be provided with a third opening IL-OPa defined therethrough. As an example, the third opening IL-OPa may be defined through a second sub-buffer layer BF2 and first, second, third, fourth, and fifth insulating layers 10, 20, 30, 40, and 50. A first sub-buffer layer BF1 may be exposed through the third opening IL-OPa. Accordingly, the first sub-buffer layer BF1 may be in contact with a sixth insulating layer 60.

A minimum width of the third opening IL-OPa may be smaller than a minimum width of a first opening BM-OP. A sidewall IL-OPSa of the second sub-buffer layer BF2 and the first, second, third, fourth, and fifth insulating layers 10, 20, 30, 40, and 50, which define the third opening IL-OPa, may more protrude than a sidewall BM-OPS of a light blocking layer BML. For example, the sidewall IL-OPSa of the second sub-buffer layer BF2 and the first, second, third, fourth, and fifth insulating layers 10, 20, 30, 40, and 50 may protrude closer to a center of the transmission area TP than the sidewall BM-OPS of the light blocking layer BML.

The third opening IL-OPa may be defined in an area overlapping a transmission area TP. For example, as a portion of each of the second sub-buffer layer BF2 and the first, second, third, fourth, and fifth insulating layers 10, 20, 30, 40, and 50, which overlap the transmission area TP, are removed, the transmittance of the transmission area TP may be improved.

Although embodiments have been described, it is understood that the disclosure should not be limited to these embodiments but various changes and modifications can be made by one of ordinary skill in the art within the spirit and scope of the disclosure as hereinafter claimed. Therefore, the disclosed subject matter should not be limited to any single embodiment described herein, and the scope of the disclosure shall also be determined according to the attached claims.

What is claimed is:

1. An electronic device comprising:
a display panel comprising:
a first area comprising a transmission area and an element area; and
a second area adjacent to the first area;
a window disposed on the display panel;
an electronic module disposed below the first area of the display panel; and a housing disposed below the display panel and the electronic module, wherein the display panel comprises:

a substrate;

a light blocking layer disposed on the substrate, the light blocking layer including a first opening that defines the transmission area;

at least one lower insulating layer disposed between the light blocking layer and the substrate, the at least one lower insulating layer including a second opening that overlaps the first opening;

pixel circuits disposed on the light blocking layer, the light blocking layer being disposed between the substrate and the pixel circuits in a thickness direction of the display panel;

light emitting elements electrically connected to the pixel circuits; and an encapsulation layer overlapping the light emitting elements, wherein the substrate overlaps each of the first opening and the second opening in plan view.

2. The electronic device of claim 1, wherein a sidewall of the light blocking layer defining the first opening of the light blocking layer is aligned with a sidewall of the at least one lower insulating layer defining the second opening of the at least one lower insulating layer.

3. The electronic device of claim 2, wherein the at least one lower insulating layer comprises:

a first lower insulating layer disposed between the substrate and the light blocking layer; and a second lower insulating layer disposed between the first lower insulating layer and the substrate, and the first lower insulating layer has a refractive index different from a refractive index of the second lower insulating layer.

4. The electronic device of claim 3, wherein the first lower insulating layer comprises silicon oxide $(SiO_x)$, the second lower insulating layer comprises amorphous silicon (a-Si), and a thickness of the first lower insulating layer and a thickness of the second lower insulating layer are substantially equal.

5. The electronic device of claim 1, wherein the display panel further comprises:

a first sub-barrier layer disposed between the substrate and the at least one lower insulating layer; and a second sub-barrier layer disposed between the first sub-barrier layer and the at least one lower insulating layer, the first sub-barrier layer and the second sub-barrier layer are disposed in both the first area and the second area of the display panel, each of the first sub-barrier layer and the second sub-barrier layer overlap each of the first opening and the second opening in plan view, and a combined thickness of the first sub-barrier layer and the second sub-barrier layer in the transmission area of the display panel and a combined thickness of the first sub-barrier layer and the second sub-barrier layer in the element area of the display panel are substantially equal.

6. The electronic device of claim 5, wherein the display panel further comprises a rear surface light blocking layer disposed in the second sub-barrier layer, and the rear surface light blocking layer is disposed in the second area of the display panel.

7. The electronic device of claim 5, wherein the substrate comprises:

a first sub-base layer;

a first intermediate barrier layer disposed on the first sub-base layer;

a second intermediate barrier layer disposed on the first intermediate barrier layer; and a second sub-base layer disposed on the second intermediate barrier layer, and the first intermediate barrier layer has a refractive index between a refractive index of the first sub-base layer and a refractive index of the second intermediate barrier layer.

8. The electronic device of claim 7, wherein a refractive index of the first sub-barrier layer is between a refractive index of the second sub-base layer and a refractive index of the second sub-barrier layer.

9. The electronic device of claim 7, wherein the first sub-base layer and the second sub-base layer comprise a polyimide-based resin, the first sub-barrier layer and the first intermediate barrier layer comprise silicon oxynitride (SiON), and the second sub-barrier layer and the second intermediate barrier layer comprise silicon oxide $(SiO_x)$.

10. The electronic device of claim 5, wherein the display panel further comprises a buffer layer disposed on the second sub-barrier layer that overlaps the at least one lower insulating layer and the light blocking layer.

11. The electronic device of claim 10, wherein the buffer layer comprises:

a first sub-buffer layer; and a second sub-buffer layer disposed on the first sub-buffer layer, a portion of the second sub-buffer layer disposed in the element area of the display panel has a first thickness greater than a second thickness of a portion of the second sub-buffer layer disposed in the transmission area of the display panel, the second thickness is non-zero, and each of the first sub-buffer layer and the second sub-buffer layer overlap each of the first opening and the second opening in plan view.

12. The electronic device of claim 10, wherein the buffer layer comprises:

a first sub-buffer layer; and a second sub-buffer layer disposed on the first sub-buffer layer, a thickness of a portion of the second sub-buffer layer disposed in the transmission area of the display panel is less than a thickness of a portion of the second sub-buffer layer disposed in the element area of the display panel, and the thickness of the portion of the second sub-buffer layer disposed in the transmission area of the display panel is non-zero.

13. The electronic device of claim 1, wherein the display panel further comprises insulating layers disposed on the light blocking layer, a number of insulating layers of the insulating layers include a third opening, and a minimum width of the third opening is less than a minimum width of the first opening of the light blocking layer.

14. The electronic device of claim 13, wherein the insulating layers comprise an organic layer overlapping the third opening of the number of insulating layers.

15. The electronic device of claim 14, wherein the organic layer comprises a polyimide-based resin.

16. The electronic device of claim 1, wherein each of the light emitting elements comprises:

a pixel electrode;

a light emitting layer disposed on the pixel electrode; and a common electrode disposed on the light emitting layer, the common electrode includes an opening overlapping the first opening in a plan view, and a minimum width of the opening is greater than a minimum width of the first opening of the light blocking layer.

17. The electronic device of claim 16, wherein each of the light emitting elements further comprises:

a first functional layer disposed between the pixel electrode and the light emitting layer; and a second functional layer disposed between the light emitting layer and the common electrode, and the first functional layer and the second functional layer overlap an area overlapping the first opening of the light blocking layer.

18. The electronic device of claim 16, wherein the pixel electrode of each of the light emitting elements is disposed in the element area or the second area of the display panel.

19. The electronic device of claim 1, wherein the display panel further comprises a sensor layer disposed on the encapsulation layer, the sensor layer comprises:

a sensor base layer disposed on the encapsulation layer;

a first sensor conductive layer disposed on the sensor base layer;

a sensor insulating layer disposed on the first sensor conductive layer;

a second sensor conductive layer disposed on the sensor insulating layer; and a sensor cover layer overlapping the second sensor conductive layer, and the sensor base layer, the sensor insulating layer, and the sensor cover layer overlap an area overlapping the first opening of the light blocking layer.

20. The electronic device of claim 19, wherein the display panel further comprises an anti-reflective layer disposed on the sensor layer, and the anti-reflective layer comprises:

a division layer including division openings that overlap the light emitting elements, respectively; and color filters respectively corresponding to the division openings of the division layer.

21. The electronic device of claim 20, wherein the division layer includes an opening that overlaps the first opening of the light blocking layer, and a minimum width of the opening of the division layer is greater than a minimum width of the first opening of the light blocking layer.

22. A display panel comprising:

a substrate;

a light blocking layer disposed on the substrate, the light blocking layer including a first opening;

a circuit layer disposed on the light blocking layer, the circuit layer comprising insulating layers and conductive layers;

a light emitting element layer disposed on the circuit layer, the light emitting element layer comprising light emitting layers disposed in an area spaced apart from the first opening of the light blocking layer in a plan view; and an encapsulation layer overlapping the light emitting element layer, wherein a number of insulating layers of the insulating layers include a second opening that overlaps the first opening of the light blocking layer, a second sidewall of the number of insulating layers defining the second opening protrudes more than a first sidewall of the light blocking layer defining the first opening of the light blocking layer, the insulating layers comprise an organic layer overlapping the second opening of the number of insulating layers, and an entirety of the organic layer is disposed between the substrate and the light emitting element layer in a thickness direction of the display panel.

23. The display panel of claim 22, further comprising:

at least one lower insulating layer disposed between the light blocking layer and the substrate, wherein the at least one lower insulating layer includes a third opening that overlaps the first opening of the light blocking layer, and the first sidewall is aligned with a third sidewall of the at least one lower insulating layer defining the third opening of the at least one lower insulating layer.

24. The display panel of claim 23, wherein the at least one lower insulating layer comprises:

a first lower insulating layer disposed between the substrate and the light blocking layer; and a second lower insulating layer disposed between the first lower insulating layer and the substrate, and the first lower insulating layer has a refractive index different from a refractive index of the second lower insulating layer.

25. The display panel of claim 23, further comprising:

a first sub-barrier layer disposed between the substrate and the at least one lower insulating layer; and a second sub-barrier layer disposed between the first sub-barrier layer and the at least one lower insulating layer, wherein each of the first sub-barrier layer and the second sub-barrier layer overlap each of the first opening and the second opening in plan view.

26. The display panel of claim 25, wherein the substrate comprises:

a first sub-base layer;

a first intermediate barrier layer disposed on the first sub-base layer;

a second intermediate barrier layer disposed on the first intermediate barrier layer; and a second sub-base layer disposed on the second intermediate barrier layer, and the first intermediate barrier layer has a refractive index between a refractive index of the first sub-base layer and a refractive index of the second intermediate barrier layer.

27. The display panel of claim 26, wherein a refractive index of the first sub-barrier layer is between a refractive index of the second sub-base layer and a refractive index of the second sub-barrier layer.

28. A display panel comprising:

a substrate;

at least one lower insulating layer disposed on the substrate;

a light blocking layer disposed on the at least one lower insulating layer;

insulating layers disposed above the light blocking layer;

pixel circuits disposed above the light blocking layer;

light emitting elements electrically connected to the pixel circuits; and an encapsulation layer overlapping the light emitting elements, wherein the at least one lower insulating layer and the light blocking layer include an opening, the pixel circuits are spaced apart from the opening in a plan view, the substrate overlaps the opening in plan view, and each of the at least one lower insulating layer is disposed between the light blocking layer and the substrate in a thickness direction of the display panel.

29. The display panel of claim 28, wherein the at least one lower insulating layer comprises:

a first lower insulating layer disposed between the substrate and the light blocking layer; and a second lower insulating layer disposed between the first lower insulating layer and the substrate, the first lower insulating layer has a refractive index different from a refractive index of the second lower insulating layer, the first lower insulating layer comprises silicon oxide $(SiO_x)$, the second lower insulating layer comprises amorphous silicon (a-Si), and a thickness of the first lower insulating layer and a thickness of the second lower insulating layer are substantially equal.

30. The display panel of claim 28, wherein the substrate comprises:

a first sub-base layer;

a first intermediate barrier layer disposed on the first sub-base layer;

a second intermediate barrier layer disposed on the first intermediate barrier layer, and a second sub-base layer disposed on the second intermediate barrier layer, and the first intermediate barrier layer has a refractive index between a refractive index of the first sub-base layer and a refractive index of the second intermediate barrier layer.

31. The display panel of claim 30, further comprising:

a first sub-barrier layer disposed between the substrate and the at least one lower insulating layer; and a second sub-barrier layer disposed between the first sub-barrier layer and the at least one lower insulating layer, wherein the first sub-barrier layer has a refractive index between a refractive index of the second sub-base layer and a refractive index of the second sub-barrier layer, and each of the first sub-barrier layer and the second sub-barrier layer overlap the opening in plan view.

32. The display panel of claim 31, further comprising:

a buffer layer disposed on the second sub-barrier layer that overlaps the at least one lower insulating layer and the light blocking layer, wherein the buffer layer comprises a first sub-buffer layer and a second sub-buffer layer disposed on the first sub-buffer layer, and a portion of the second sub-buffer layer that overlaps the opening has a smaller thickness than a portion of the second sub-buffer layer external to the opening, a thickness of the portion of the second sub-buffer layer that overlaps the opening has a non-zero thickness, and each of the first sub-buffer layer and the second sub-buffer layer overlap the opening in plan view.

33. The display panel of claim 31, wherein the insulating layers comprise:

inorganic layers disposed on the light blocking layer; and an organic layer disposed on the inorganic layers, wherein the inorganic layers include an insulating opening that overlaps the opening, and the organic layer overlaps the insulating opening.

34. The electronic device of claim 1, wherein each of the at least one lower insulating layer is disposed between the pixel circuits and the substrate in the thickness direction of the display panel.

* * * * *